(12) United States Patent
Ilyanok

(10) Patent No.: US 6,570,224 B1
(45) Date of Patent: May 27, 2003

(54) QUANTUM-SIZE ELECTRONIC DEVICES AND OPERATING CONDITIONS THEREOF

(76) Inventor: Alexander Mikhailovich Ilyanok, 10-1-72 Zhukovsky Str., Minsk, 220007 (BY)

(*) Notice: Subject to any disclaimer, the term of this patent is extended or adjusted under 35 U.S.C. 154(b) by 0 days.

(21) Appl. No.: 09/622,067

(22) PCT Filed: Dec. 29, 1999

(86) PCT No.: PCT/BY99/00012

§ 371 (c)(1),
(2), (4) Date: Jul. 11, 2001

(87) PCT Pub. No.: WO00/41247

PCT Pub. Date: Jul. 13, 2000

(30) Foreign Application Priority Data

Dec. 30, 1998 (BY) .................. PCT/BY98/00012

(51) Int. Cl.⁷ ............................................. H01L 27/01
(52) U.S. Cl. ....................................................... 257/350
(58) Field of Search .......................................... 257/350

(56) References Cited

U.S. PATENT DOCUMENTS

| | | | |
|---|---|---|---|
| 5,401,980 A | 3/1995 | Fang et al. | |
| 5,411,937 A | 5/1995 | Wendt et al. | |
| 5,584,890 A | 12/1996 | MacFarlane et al. | |
| 5,643,480 A | 7/1997 | Gustavsson et al. | |

FOREIGN PATENT DOCUMENTS

| | | |
|---|---|---|
| EP | 0 437 691 A1 | 7/1991 |
| JP | 283759 | 10/1993 |
| JP | 05283759 | 10/1993 |
| WO | WO 99 27584 | 6/1999 |

OTHER PUBLICATIONS

H. Dal, E Wong, Y. Lu, S Fan & C Liever—Synthesis and Characterization of Carbide Nanorods Letters to Nature 1995.

Tans S J et al, "Individual Single–Wall Carbon Nanotubes as Quantum Wires", Nature Apr. 1997.

Fukuda, Nakagawa & Hirose, " Resonant Tunneling Through a Self–Assembled Si Quantum Dot" App. Phys. Lett. Apr. 1997.

V. Chandrasekhar, Z. Ovadyahu & R. Webb, Single Electron Charging Effects in Insulating Wires Physical Review Letters Nov. 1991.

Gate–Voltage Studies of Discrete Electronic State in Aluminum Nanoparticles, By D. Ralph, C Black & M. Tink, Physical Review Letters, May 1997.

K Katayama, D. Hisamoto, Y. Nakamura N. Kobayash A New Field Effect Transistor Based on Metal Insulator Transition JATP Mar. 1996.

K Tennakone, C. Lokuhetti, S. Wickramanayake et al The Possibility of About Room Temperature Superconducting Phase in CuBr $CuBr_2$res, J. Phys. C. 1998.

B. Riley et al, Meissner Effect Ut 70 300K in Microscopic Regions of Y–Ba–Cu–O Physical Review Jan. 1988.

*Primary Examiner*—Mark V. Prenty
(74) *Attorney, Agent, or Firm*—David Newman Chrtd.

(57) ABSTRACT

Quantum-size electronic devices comprise electrodes and at least one cluster seperated from the said electrodes by a tunnel-transparent gap. The characteristic dimensions for elements of quantum-size devices are determined by the formula in the range 1×4 $r_0$, wherein $r_0 = \hbar/(m_e \alpha^2 c)$, wherein $\hbar$ is Planck's constant, $m_e$ is the electron mass, $\alpha = 1/137,036$ is the fine structure constant, c is the light speed. The cluster may be made of a semiconductor material, conductor, superconductor, high-molecular substance or a covering with a tunnel-transparent dielectric. The matured theory provides possibilities for designing logical devices operating in the mode of transfer and/or storing of several electrons at normal conditions and high temperatures. The operating conditions of the devices are determined. The invention provides basic condition for constructing of high-temperature superconducting components and devices based thereon, as well as for transmitting electric signals and energy loss-free.

102 Claims, 10 Drawing Sheets

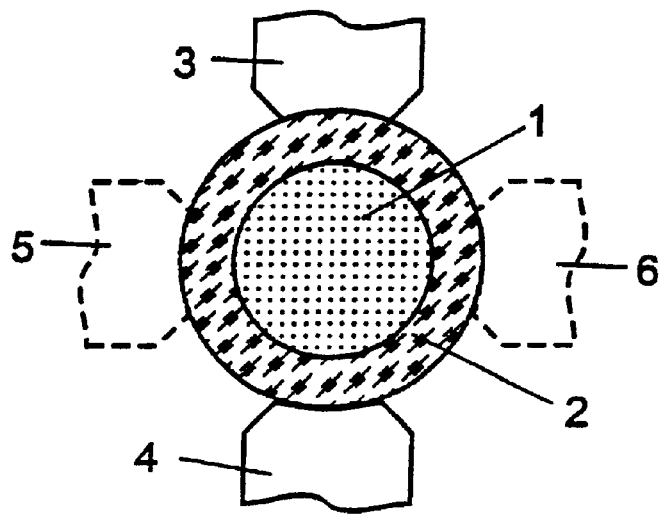
Fig. 1.
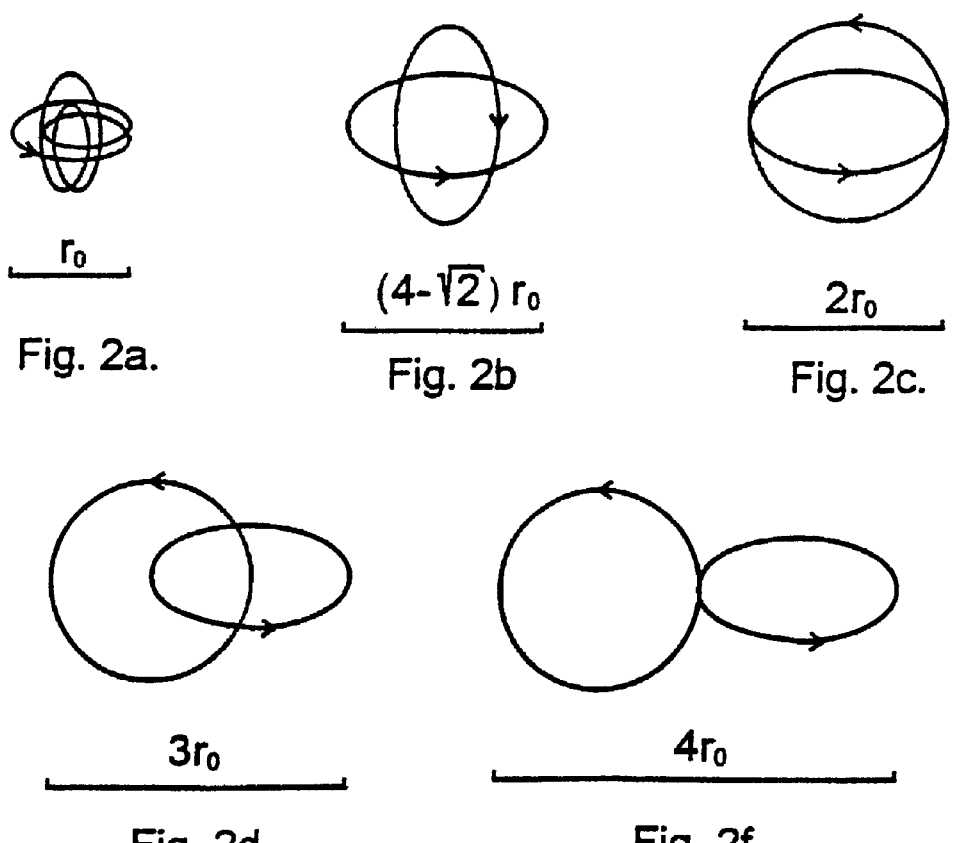
| $r_0$ | $(4-\sqrt{2})r_0$ | $2r_0$ |
| --- | --- | --- |
| Fig. 2a. | Fig. 2b | Fig. 2c. |
| $3r_0$ | $4r_0$ |
| --- | --- |
| Fig. 2d. | Fig. 2f. |

QUANTUM-SIZE ELECTRONIC DEVICES AND OPERATING CONDITIONS THEREOF

FIELD OF THE INVENTION

The invention relates to the field of electronic components and conductors, and, in particular to multifuctional and electronic components of integrated circuits (ICs) having minimum accessible outline dimensions, maximum speed and maximum operating temperature. The components and conductors working on basis of quantum size resonance effects are used for constructing two-dimensional (planar) and three-dimensional electronic devices, ICs designed for processing and converting of analog and digital information, as well as for transmitting electric signals and energy loss-free.

BACKGROUND OF THE INVENTION

IC elements tend to scale down. However at downsizing of IC elements to less than 100 nm, charge carriers start revealing the discreet nature and the quantum mechanical characteristics thereof, what makes influence on constructive features of active devices, i.e. transistors.

At the same time, at the dimension of less than 100 nm separate transistor elements, actually are small particles, i.e. clusters [1]. Downsizing a cluster may create a condition allowing to design devices that are able to control groups of electrons, and even one electron.

Prior art describes a large class of electronic devices basing on single-electron tunnelling through a small size cluster [2]. The simplest variant of such a device is a kind of analogue of a field-effect semiconductor transistor comprising between the drain and the source thereof an isolator with a built-in small cluster in the centre. Such a transistor is generally referred as SET—Electron Transistor).

A cluster built-in the isolator of a SET device has its own capacity in relation to the substrate $C_c$. The core of the effect disclosed in [2] is that during tunnel passage through the cluster of an electron with e-charge, the electron changes the potential of the cluster by the magnitude $\Delta U = e/C_c$ and blocks by its field the passage of other electrons for a while it is present at the cluster. In the process, it is necessary that the potential at the cluster exceeded the potential of the thermal noises of the cluster capacitance:

$$\Delta U \geq 2kT/e \qquad (1)$$

wherein k is the Boltzmann's constant, T is an absolute temperature.

For example a spherical silicon cluster with a radius $r_c = 5$ nm having a dielectric permeability $\in = 11.7$, will have the capacitance $C_c = 4\pi \in_0 \in r_c$ and, hence on basis of (1) will have the maximum operating temperature of the device $$T = e^2/(8\pi \in_0 \in r_c k) = 143 \text{ K}(-130° \text{ C.}) \qquad (2)$$

wherein $\in_0$ is the vacuum dielectric constant.

This condition shows that use of materials with $\in < 5.6$ or clusters of the smaller size, generally provides a possibility of designing a single-electronic quantum device, operable at the normal temperature—290–300 K (17–27° C.). However, there is no physical sense in considering a separate cluster as a microcircuit component without taking into consideration the capacitance of transistor electrodes. Therefore there exists a problem of considering all parasitic capacitances.

As it is disclosed in [3] a field semiconductor transistor with the isolated gate may register a single electron. In this case the structure of the proper transistor canal does not influence the analysis. Therefore for any devices of this kind, including nanometer devices, it is necessary to consider the input capacitance $C_i$ as well as the output capacitance $C_a$. Thus, the multiplier $C_a/C_i$ should be added to the formula (1) in accordance with [3, formula (7.36)]

$$(C_a/C_i)\cdot(e/C_c) \geq 2kT/e \qquad (3)$$

From this expression follows that, in case the entrance control signal is present on the gate or cluster and the conductor has an admissible size, e.g. the conductor length is about ~1000 nm and the conductor width is about ~10 nm, the conductor capacitance for a silicon substrate will be $C_i \approx 100 C_c$. Accordingly, at the acceptable speed the operating temperature of the device is in all T=1.43° K (−271.72° C.). Right this temperature is the limit for the most of known SET-devices [4–7]. The said researches, which describe approaches to realising high temperature single electronic tunnelling, in fact made use of one and the same method disclosed in [2]. For example, metal clusters of a size less than 50 nm were placed between two electrodes applied to a dielectric [4] or similarly, fullerene clusters of a size at all 0.634 nm were regularly spaced in the dielectric layer [5]. Various logical devices for designing the digital memory with logical elements having a size of structures from 0.2 nm to 100 nm are investigated in [6,7]. Meanwhile, the paper [2], being a close prior art solution for all the aforementioned papers, has got a mistake of principle. In particular, the dimensionless coefficient $C_a/C_i$ was not considered in the paper [2]. As a result, the mistake from the paper [2] propagated to the majority of patents, in which the single tunneling principle was used. Due to this error a large number of patents granted for SET devices are to be transferred to the category of pure scientific papers having no commercial use. Meanwhile, it is very difficult to rectify this error by technical methods, whereas all active elements should be connected by electric conductors, the size of which could hardly be diminished to the size of the most active element. Hence, a big parasitic capacitance of supply electrodes will always exist. In fact, the only known solution of this problem exhibit biological objects. For example, in the brain of an animal information is transferred between the active elements—neurons—not by means of passive electric conductors, but rather by means of specific conductors—axons. Practically, axons are active distributed communication lines, i.e. axons consume external energy for creating a process of transferring electric impulse. If neuron-axon links are considered as the most close prior art, then the problems will be created by their big sizes (of the order of micrometers) and slow advance of electric impulses (several meters per second) caused by the ion-type conductivity. For the rest, this principle may serve for the present invention as a good prior art solution. Moreover, brain is a distributed computing system (of a neuron type) relating to self-learning systems. Hence, brain elements—neurons—may serve as prior art logical elements for the claimed invention.

In a number of other researches [8] the more traditional methods make use of building-in a cluster in a gate insulator of a field transistor. Charging and discharging the said cluster yet by a group of electrons tunnelling through the dielectric (insulator) provides a possibility to change the characteristics of the field transistor so that to create an analog or digital memory. However, the time of charge storage is insufficient in this case.

It is obvious from the descriptions of the aforementioned patents that space capacitances of conductors that connect transistors were not considered there. And naturally, operating temperatures exceeding the temperature of fluid helium were not obtained there.

The research [9] corresponds to a certain progress in the field of increasing operating temperatures of SET devices to normal conditions. The authors placed a 30-nm titan cluster between titanium electrodes of the 3-nm thickness spaced at a distance of 50 nm. The gap between the cluster and electrodes was filled with tunnel-transparent dielectric of $TiO_x$. Supplying at normal temperature a small voltage of 0.1–0.7 V produces four N-shape regions in voltage-current characteristics. This extraordinary effect was explained by a single electron tunnelling. Meanwhile, being aware that the titanium oxide has ∈=24 and taking additionally into consideration capacitance of the cluster and electrodes respective the substrate it is obvious that the operating temperature should be well below normal. It is clear that the researchers faced the effect that might be caused by extraordinary characteristics of the proper dielectric $TiO_x$ film.

In fact, all dielectrics to a more or less extent have non-linear regions, the specific resistivity of which depends on the electric-field intensity. At the starting section of this response the specific resistivity does not change up to the electric-field intensity of $10^4$ V/cm. The specific resistivity further decreases on account of creation of additional carriers released from traps-donators [10, c. 264]. If a dielectric is a high-molecular compound, the current flows through it along spherolites, i.e. certain channels formed by long molecules. Excess of the value $10^5$–$10^6$ V/cm generally causes irreversible breakdown of the dielectric i.e., mass transfer and destruction of molecules start directly in breakdown paths. The volume content of donators of thin-film dielectrics is not sufficient for formation of breakdown paths; therefore film breakdown takes place at the electric-field intensity of a greater order. For example, when a $Si_2O_3$ film of a thickness of about 15 nm has the electric-field intensity not more than 8 MV/cm. If the number of traps-donators is sufficient, the dielectric has an ability to store the charge that had passed through the said path. This ability to store a charge is widely used in electronics for designing a reprogrammed memory. However, the said memory operates with a large number of electrons, accumulated in numerous traps of different energy characteristics. This causes a constant charge leakage from the traps, and consequently, changes device characteristics. Therefore, they cannot be used in nanosized devices operating with single traps.

The further significant non-linear characteristic of dielectrics is the avalanche discharge of a dielectric. The function of the said discharge is to limit the output signal. In this case the discharge proceeds without any destruction of a material, for example in wide-gap semiconductors, designed in the form of ZnO multilayer polycrystalline films. The size of crystallites-clusters in these films is 0.2–15.0 μm. They are divided by $Bi_2O_3$ tunnel-transparent gaps of the thickness 2.0–10.0 nm [11]. Meanwhile, the researchers do not disclose the nature of changes of film characteristics upon minimising crystallites to nanosizes, i.e. to less than 0.1 μm. Moreover, such output signal stoppers lack any amplifying characteristics, what limits the field of their use.

It is known, that the classes of elements having N- and S-shaped characteristics allow amplifying and non-linear transforming a signal. It is common knowledge that N-shaped characteristics are found in the devices in which electron drops—domains have been formed. Generally, S-shaped characteristics appear due to generation of current paths [12,13]. However, the provided characteristics of non-linear elements are drawn as a rule for samples of a micron and a larger size, what prevents from mechanical applying such characteristics to nano-sized samples. Moreover, these non-linear characteristics are specific only for two electrode devices, what limits the field of their use in nanoelectronics.

The important kind of non-linear characteristics are hysteresis loops based on the Josephson effect in superconductors as well as similar hysteresis characteristics [14]. However, devices based on the Josephson effect and other tunnel effects between superconductor and semiconductor, superconductor and metal and etc. are controlled by applied current or applied magnetic field. Designing current sources for control of josephson devices require a rather high voltage, resulting in overall energy loss. Moreover, inducing of an applied magnetic field requires coils or loops produced by means of lithography what renders this approach rather bulky. Available superconductors, that may be used in Josephson devices have critical temperatures not exceeding −182° C., which requires use of cryostats and enlarges overall dimensions of devices. All this renders problematic the use of these devices in nanoelectronics.

Similar non-linear characteristics have a number of amorphous and polycrystalline films of semiconductors [15] or materials, having metal-semiconductor phase transition (MSPT) [16], including MSPT basing on high-molecular organic semiconductors $(BEDT-TTF)_mX_n$ [17] or basing on Lengmurr-Blodgett films of stearic acid in the form of a molecular single electronic transistor [18]. In this case, the process of electron passing in lengmur films with built-in nano-sized clusters was controlled by the orthogonal needle CTM [18]. Naturally, this geometrical configuration makes the capacitance of the control electrode-needle substantially lower than in the formula (3), which allows to observe quantum effects at normal temperatures and low speed. However, the capacitance grows, when a control electrode is applied to the substrate, and at acceptable speed the device may work only at low temperatures. Thus, the patent claimed one model, but the measurements that illustrated operation at high temperatures, were demonstrated on the classical CTM model.

Elements having characteristics with hysteresis loops allow to store information, i.e. to design memory cells. Information in the cells is recorded by means of electric current. Moreover, there are hysteresis characteristics of magnetic materials, which may be similarly used for designing memory cells. Information in these cells may be recorded by means of additional external fields. For example [19] reports on a variant of writing information into a single cluster by means of the electron spin-flip under the action of photons in the magnetic semiconductor films of a nanometer thickness in the system PbTe—EuTe—PbTe.

The superior magnetic material such as SmCo has the magnetic field stored energy of not exceeding 5 J/mole. Thermodynamic analysis for this material show that the minimum size of the magnetic cluster meeting reasonable requirements for information storage for more than a year at a normal temperature, should be above 100 nm. Accordingly, the device of [19] is actually limited by these dimensions. Therefore, magnetic materials are not yet perspective for nano-size devices.

Further approach to designing of active nano-size quantum devices [12] is based on producing a kind of atom-like device—a super atom of a spherical form made of semiconductors according to the super lattice technology. Here spherical layers of super lattices surround the nucleus of a size 3–10 nm. The overall diameter of such cluster is 71 nm. The electrons in the device move along surfaces of super lattices around the charged nucleus. However, the electron bound energy in such "envelopes" is about ~1 meV, which accordingly requires temperatures of liquid helium. Thus, the said approach to designing electronic nano-size devices for normal temperatures is not the future-technology.

Meanwhile, among the aforementioned examples at least only a metal-semiconductor phase transition (MSPT) is supported by the axiomatic theory that approximately describes non-linear S-shaped volt-amps diagrams. This theory is based on thermodynamic instability and presence of hysteresis in the metal-semiconductor transformation point on the account of change of the crystalline structure. Persistence of all thermal processes at recrystallization in the S-devices at MSPT renders them unpromising for use in microelectronics and all the more so in nanoelectronics.

Non-linear characteristics advantageous for use in active nanoelectronic elements often appear with decreasing device dimensions. For example, a tunnel current develops between electrodes, when the thickness of the dielectric located between electrodes decreases to less than 8 nm [12, p.93]. This current is described as developing due to probable tunnelling of electrons through the energy barrier of a predetermined form. However, substantial abnormalities developing on the barrier at small voltages of 1–300 mV [13, p.371] cannot be described by probabilistic approaches. Moreover, the critical size of the barrier of ~8 nm is not evident from any theory.

N-shaped characteristic develops in semiconductor diodes with a high doping level, namely tunnel diodes. This characteristic is described by tunnelling of carriers in a semiconductor through p-n junction A normal width of p-n junction in such a diode subject to voltage is 10–15 nm, and the electron de Broglie's wavelength is not more than 3 nm. Hereupon the tunnel effect should not be observed under the classic theory [20, p.349]. In fact, volt-amps diagrams of tunnel semiconductor diodes have a valley that is claimed to the tunnel current appearing upon interaction of carriers with phonons and photons of the semiconductor of the p-n junction grid. Nevertheless, neither models available in this case are able to describe such abnormalities at volt-amps diagrams as residual stored current in the volt-amps valley and rising a bulge at volt-amps diagrams at the additional doping of the junction and some other abnormalities [13].

As it is made apparent in this chapter the state of art of available models of SET devices and other non-linear devices considering all additional factors do not allow to reckon and, consequently, to design a high temperature logical circuit. Use of thermodynamic models for reckoning causes great problems since they do allow computing the concrete speed of devices. The known models that describe tunnelling of electrons with N-shaped characteristics do not express numerous features of volt-amps diagrams and do not allow determining design requirements for nano-sized devices.

When designing integrated circuits basing on quantum size electronic devices, one also faces the problem of galvanic cross coupling of single microcircuit parts, i.e. creation of certain quantum size transformers.

Thus, it follows from the aforesaid that the physical principles, which are to be applied to designing of active elements, still remain unknown. Moreover, the physical limitations of a size, speed and operating temperature of a device have not been determined yet.

BACKGROUND OF THE INVENTION

Actually, the fundamental problem of the solid state physics and of physics in general, is the absence of fundamental particle models that are adequate to experimental data. Thus, an ordinary electron is represented as either a uniformly charged sphere; or as a charge concentrated on a spherical shell; or as a certain formation diffused in space that is characterized by the density of a probability of a charge or a mass. In this case it is supposed, that the dimensions of an electron are featured in its classical radius, the dimension of which is close to a nucleus radius. The value of the classical radius of an electron is close to the value obtained in experiments on scattering of "free" electrons. However, no direct experiments on measurement of an electron radius in a condensed substance were ever conducted. Therefore, theoretical models for metals and semiconductors generally use the classical radius value of an electron or the dimension of its de Broglie's probability, wave. However, when using these models, one fails to characterize precisely such major characteristics of materials as electrical conductivity, thermal conductivity, electronic heat capacity, superconductivity and a number of other characteristics. In particular, to characterize experimental data semiconductor physics generally uses a set of the individual physical theories with a lot of parametrical coefficients. Attempts to calculate of new devices reveal that calculated data seldom coincide with experimental data. From here it follows, that these models are not adequate and do not allow to create new devices with the new characteristics. As a result of this factor, the progress in the field of a nanoelectronics and nanotechnology was slowed down in general. It is possible to assume, that this crisis is stipulated by erroneous representation of the shape and dimension of the proper electron existing in a solid body.

Thus, creating very large scale integrated circuit devices (above $10^9$ active elements) for processing information at normal temperature is possible only by means of using more precise quantum-mechanical models and by developing on their basis new methods for optimization of operating conditions of very large scale integrated circuit devices.

The proposed application first considers a new model of an electron in the form of a ring. This model has allowed to characterize precisely a set of experimental facts that were known but treated in a wrong way, and to predict new effects, on the basis of which it is possible to create a new class of quantum-size electron devices.

In essence, the proposed patent application uses a discovery in the field of physics and, in particular, in the field of electron physics and condensed substance physics. The essence of the discovery is a deterministic approach to quantum mechanics from micro to macro objects. A part of this discovery was filed as a patent application. This fact may create certain difficulties at examination of the application due to absence of open publications of the theory. A new class of patentable devices follows from this theory. Meanwhile, unpatentable chapters of the theory relating to quantum macrosystems were published in the paper [21]. The theoretical and practical data in this paper agree with the extreme accuracy. This fact is significative of the high reliability of the theory in general.

SUMMARY OF THE INVENTION

The aim of the invention is increasing operating temperatures of quantum size devices, what control one two or more electrons passing through quantum size devices of the kind, and that have the extreme accessible speed at minimum permissible dimensions. Such devices may be fabricated by means of two-dimensional and three-dimensional technology.

Theoretical investigations and analysis of experimental evidences resulted in designing a model of interaction of electrons in condensed mediums. The model provides a rather accurate correspondence to the experimental evidences. According to the said model, in condensed mediums electrons may occupy certain stable states with minimum energy and a low profile of interaction with atoms of the medium.

The theoretical model of the mechanism of interaction of electrons in condensed mediums and examples of the preferable embodiments of the invention are disclosed hereinafter in the description of the invention.

At present the only way to increase the operating temperature of a device is to reduce the cross section of interaction of an electron with short-wave phonons and infrared photons of the substrate and the proper material of the device.

At the same time, it is a common knowledge that the cross section of interaction of a free electron is close to the classical radius thereof $r_1 = \alpha\hbar/m_e c$. The cross section of Compton scattering of a gamma quantum at an electron in condensed mediums gives an electron radius $r_2 = \hbar/m_e c$, and a cross-section of scattering of a hydrogen atom is equal to Bohr radius $r_3 = \hbar/m e \alpha c$. Here $\hbar = h/2\pi$ is the Planck's constant, $\alpha = 1/137.036$ is the fine structure constant, $m_e$ is the free electron mass and c is the light speed.

The differential geometry teaches that any space may be discomposed to embedded tori (anchor rings), or in a particular torus case—to embedded spheres [21]. Let us select the step of space decomposition at tori. Let us postulate that in condensed medium the maximum size of an electron wave is:

$$r_0 = \hbar/(m_e \alpha^2 c) = 7.2517 \text{ nm} \qquad (4)$$

At the said size and speed of the wave motion $\alpha^2 c$, the electron will have the minimum possible energy in a condensed medium.

Basically, this assumption meets the original idea of Kelvin proposed still in the 19th century. He assumed that an electron is a current vortex. Further de Broglie (1924) developed this model together with his co-authors [22]. Other authors who presented an electron as a torus [23, 24] used the similar models. However, the size of the major radius of torus in their models does not exceed the Compton radius thereof, $r_2 = \alpha^2 r_0$, and the minor torus radius tends to zero.

Let us extend this model by introducing a major torus radius equal to $r_0$, and limiting the minor torus radius by the classical electron radius $r_1 = \alpha^3 r_0$. This formation is the only closed oriented two-dimensional surface that allows a vector field non-singular in every point. As it is evident from the differential geometry, no other topology allows equilibrium of an isolated system with a self-action in the form of the like charged medium.

Considering the aforementioned the electron ring wave with equally distributed charge e will get the term "ring electron". Extremely important is the fact that due to axial symmetry of the distributed rotating charge, such a ring emits neither electromagnetic nor gravitation waves, i.e. it has an absolute stability.

While presenting an electron as a point charge orbiting around a nucleus in the Bohr model or a certain charge-distributed rate in Schroedinger's model, one must postulate the stability of the charge by introducing discrete energetic levels, at which the electron does not emit electromagnetic waves. In our case, the stability of the electron is automatically conditioned by the geometry thereof.

Experimental evidences of rightfulness of such handling of size and form of an electron are provided below.

Quantum size effects occur in various condensed mediums, e.g. the quantum Hall effect in thin semiconductor layers at low temperatures [25]. Here the density of allowed states at Landau's levels is equal to the quantum density of the magnetic flow $n_4 = 1/2\pi r_4^2$, where $r_4 \approx 7$ nm is a so-called magnetic length discretely relating to the radius of the electron orbit for the lowest Landau's level, i.e. here electrons are presented as thing ring-like waves with intervals between rings$\approx\sqrt{2} r_4$. In their turn the rings are located in one plane.

At normal temperatures there was registered a characteristic formation, the size of which was determined by the size of an electron ring. The formation emerges at mechanical interaction of two planes in the 0.1M HCl electrolyte. This formation has a size of an order 7.5 mn [26, p.170]. Moreover, it is exceptionally rigid. In the course of a number of experiments it was observed that formations of a similar size and rigidity usually emerged at the initial phase of the transition of a substance from a liquid-phase to a solid-phase [27].

The suggested electron model with a radius $r_0$ allows explaining the abnormal effects occurring in metalelectric junctions in a rather simple way without referring to probabilistic models. If we conceive an electron as a certain ring with a radius $r_0$, then such a ring may easily cross a potential well of a smaller size, e.g. less than 8 nm. Such an utterly simplified mechanic explanation bears a fundamental meaning, which is not connected with a particle regarded as a certain density of probability distributed in the space. And in this case it is not necessary to conceive the particle tunnelling through any potential barrier.

Using a ring electron model one may describe all main features of current-voltage curves of tunnel semiconductor diodes. It is possible to conceive that formation of clusters with the radius $r_0$ is possible in specific oversaturated solid solutions of heavily doped semiconductors. This cluster acts as a nucleus and it is surrounded by a solvating sphere of a less doped semiconductor, i.e. here a kind of pseudoatom with a tunnel transparent single-layer or multiplayer sphere of a thickness not exceeding $r_0$. This results in creating a bulk formation with a total diameter of $d \approx 4 r_0 \approx 29$ nm. With the structure of the kind, there is a probability of formation of an electron ring that is moving between the sphere and the surface of a nucleus totally environing the nucleus. Once being formed, the electron may be presented in a form of a current ring, characteristics of which may be calculated.

It is a common knowledge that a thin ring current of a radius $r_0$ with a charge e generates on the x-axis, an electric and a magnetic field, accordingly [28]:

$$E = (ex/4\pi\varepsilon_0) \cdot (r_0^2 + x^2)^{-3/2} \qquad (5)$$

$$H = (I r_0^2/2) \cdot (r_0^2 + x^2)^{-3/2} \qquad (6)$$

wherein $I = \alpha^2 ec/2\pi r_0$ is a ring current. It follows from this expressions that on the axis x E-field has the maximum potential at the distance from the centre of the ring $r_0/\sqrt{2}$, and the H-field has no maximum characteristics. Accordingly, at the distance from the ring centre $\leq r_0/\sqrt{2}$ the other free electron will be electrostatically attracted to the ring. And besides, in the centre of the cross section plane of such a ring the electric filed density is equal to null. Because of this in the centre of the ring there is formed a potential well having at its bottom point the energy of interaction with the point charge equal to null. In the process of passage of an electron in the crystal, some ions of crystal lattice core occur into the electron potential well. It results in reducing the energy of ion interaction with the ring electron at least by $\leq \alpha/2\pi$. In this case interaction of the ring electron with all other surrounding charges will be mainly determined by the part of the electrostatic field lying beyond the square surrounded by this ring. It is possible to show that the value of this filed will be of an order αe.

If a ring is placed into the external magnetic filed B, then the precession frequency thereof will be $\omega_e = B\alpha e/m_e$. It follows from this equation that the effective electron mass is $m^* = 137.036\, m_e$. Therefore reduction of the cross section of electron interaction with fluctuations of the ion grating (with phonons or infra-red photons) may be regarded as an to increase of the electron effective mass, and accordingly, the decrease of the space shift, imparted to it by a phonon (or IR photon). The reduction of interaction cross section may also be interpreted as the reduction of Coulumb's interaction between the lattice charge and the proper electron by factor of αe. In consequence of the aforesaid the electron looks like being "senseless" towards characteristics of the medium, which it is passing.

Vivid proofs of existence of heavy electrons are superconductors with f-electronic E systems. For example for systems of the type $UBe_{13}UPt_3 m^* \cong 137 m_e$ [29]. It will be noted that for semiconductors $m^* < m_e$, for metals $m^* \cong m_e$. At normal temperatures it is possible to find heavy-electron systems. For example, in materials having a $VO_2$ type metal-semiconductor phase junction the effective electron mass is $m^* \cong 60\, m_e$ [16, p. 33].

Thus, the validity of the proposed theoretical model of an electron ring in a condensed phase is fully founded and supported by independent experiments. However, the occurrence of the electron is possible only under specific external impacts, for example temperature, high forced external field, and other transient processes. Owing to this fact, the phenomenon cannot be registered by standard measurements in stationary conditions, by registering an electron mass in semiconductors.

One of such non-stationary states in semiconductors occurs at pulse lightening thereof. With this are formed bounded states electron hole—exitons. They are usually described by Bohr's model with the radius $r_5 = \in r_3/m_5^*$, where $m_5^*$—is the equivalent exiton mass. However, the multiplier $\in/m_5^*$ may be presented be means of a model of an electron ring. As the interaction cross seduction of the electron ring with the lattice goes down as αe, then $\in \approx 1$, and $m_3^* \approx m_e/\alpha$. Accordingly, the exiton radius $r_5$ should not be more than $r_0$. With this the exiton energy will not exceed $(\alpha/2\pi)W_3 = 15.8$ meV, where $W_3 = m_e(\alpha c)^2/2$ is the energy of the main level of the Bohr atom. In this case the spaced three-dimensional condensation of electrons into exciton droplets should have the concentration $N_5 \leq (r_0/\sqrt{2})^{-3} = 7.42 \cdot 10^{18}$ cm$^{-3}$. The densest droplets appear in Si. They have $N_5 = (3.0 \div 3.37) \cdot 10^{18}$ cm$^3$ and the energy of bounding excitons into droplets $W_5 = 8.2$ meV, what fully meets the aforementioned limits and agrees with experimental data described in [30].

The big exciton with the radius of an order $r_0$ is generally named as Wannier-Mott's exciton. Experimental data show that when the exciton size diminishes to 0.1–1.0 nm it is transformed into Frenckel's exciton [30]. In this case electron ring with the radius $r_0$ will simply roll up to the size of the period of lattice of the atom fime, and the ring speed will increase in the order of the speed on Fermi's surface. Electrons will have the maximum speed value on Fermi's surface. The said value does not exceed the magnitude of αc.

Thus, the proposed theoretical model of an electron ring allows, without using any probability models, a new approach in describing most of time-varying and non-linear processes occurring in condensed medium.

It follows from the foregoing analysis that in certain materials it is possible to induce a condition of formation an electron ring by means of an external action and/or by nanostructuring of a medium. By that are provided resonance conditions for operating nanoelectronic devices, which conditions allow their functioning at normal and higher temperatures. This model has become a basis for designing a number of new devices with new operation modes in according with the further going specification and the attached claims.

The essence of the invention is as follows.

In accordance with one embodiment of the invention a quantum size electronic device comprising electrodes, at least one cluster and a tunnel-transparent layer is characterised in that the cluster has at least one distinctive size, determined from the formula:

$$r = a \cdot r_0,$$

wherein $r_0$ is a (ring) radius of an electron wave under the formula:

$$r_0 = \hbar/(m_e \alpha^2 c)$$

wherein $\hbar$ is the Planck's constant, $m_e$ is the electron mass, α is the fine structure constant = 1/137,036, c is the light speed, a is a coefficient, determined in the range of $$1 \leq a \leq 4.$$

With this the thickness of the tunnel-transparent layer does not exceed $r_0$, and the distance between electrodes does not exceed $r_0$.

According to the invention a cluster may be made of metal, semiconductor, superconductor, high-molecular organic material. Besides, it may be also made as a cave with an enclosure in the form of a tunnel-transparent layer.

In a number of embodiments a cluster may have not only a spherical form but also a central-symmetric form.

The central-symmetric shape of a cluster allows to create both two-dimensional, and thnee-dimensional logic and analogue structures. Thus, the operation temperature of devices based on such clusters will increase proportionally to Q-factors of a resonator and may be as high as the destruction temperature of the proper materials of a cluster. A cavity in the tunnel-transparent shell functions as a resonator of the said kind. In this case the cavity may be filled with both gas and with the above listed materials. Calculation of resonator parameters and operation conditions of devices basing on the resonator are disclosed below.

Under a still further embodiment a cluster may have an axisymmetric form, and also may be made extended and have a distinctive cross section size determined by the formula $$d = br_0,\ 2 \leq b \leq 4,$$

In a further embodiment an extended cluster may have along its axis a regular structure with a period determined by the formula $$\tau = br_0,\ 1 \leq b \leq 4,$$

In accordance with further development of the invention, a plurality of clusters may be regular arranged at least in one layer, the gaps between the clusters should be tunnel-transparent and not exceed $r_0$.

It is obvious, that extended axissymmetric clusters can create resonant requirements for electrons due to their cross dimensions. At the same time, unlike central-symmetric structures, they are more convenient for using for planar single-layer designs. Actually, planar technology is the leading one in the electronic industry. The technology of constructing regular channels in dielectric and semiconductor films is designed well enough. Hence, it is possible to create quite simply tunnel-transparent gaps between axissymmetric clusters. Such technologies can serve as a transitional step to three-dimensional technologies of the future.

Layers consisting of both central-symmetric clusters and axissymmetric clusters are in fact, an active medium. Under certain conditions (at supply of external electric field), a wave of charges may propagate in the medium of this type. It happens similarly to transmission of a nervous electric pulse along axons in a cortex.

Alongside with active medium, clusters may be used as separate electronic devices, provided two or more electrodes are connected to them. In this case it is necessary that these electrodes had minimal parasitic capacitances (dimensions). Naturally, if two electrodes are connected to a cluster, it functions as a peculiar diode. If three and more electrodes are connected to a cluster, it functions as a peculiar tnnnsistor, etc.

Thus, at least two electrodes should be connected to clusters, one of the electrodes being a control one.

Clusters may be also connected to at least three electrodes, at least one of which is a control electrode.

Parameters of electronic devices made of clusters will depend not only on their dimensions, but also on electrical properties of the material of the electrodes connected to them. This is due to the fact that dimensions of an electron and the mechanism of its motion in electrodes are closely related to parameters of the medium, in which it propagates, dimensions of the medium, external fields and temperature. It is obvious, that, when in the process the motion of an electron through a cluster, the electron is controlled by the field of the electron that is present in the electrodes (a control electron), the mutual correlation of fields is very essential. In this case, it is meant; those electrons have a determined (not a probabilistic) structure. Moreover, an important moment is the shape of the electron emitted from the input electrode into the cluster. Hence, the characteristics of the device in general depend on the size and material of the cluster as well as on the size and material of the electrodes.

According to further development of the invention, electrodes may be made of conductor and/or semiconductor, and/or superconductor, and/or conducting organic materials.

Clusters may be also united into groups and form one-dimensional and/or two-dimensional and/or three-dimensional structures.

Arrangement of clusters into groups may be performed by means of mutual location of discreet electrodes, and also by the form of discreet electrodes.

In a further embodiment of the invention clusters may be arranged into isolated space groups, which are connected to the corresponding electrodes.

Whereas in the process of reducing dimensions of electrodes, a ring electron tends to leave an electrode or to coil up to the smaller dimensions, the sizes of electrodes should be limited by some critical value.

In the event of using electrodes made of superconductor, the cross section size of electrodes should be limited by the size $d \geq 2\ r_0$.

According to another embodiment electrodes are made of the material having a MSPT and a cross section size $d \geq 2\ r_0$.

In the event of using electrodes made of conductor, the cross section size of electrodes may be limited by the size $d \geq r_0$. In this case the resitivity of the conductor should be not less than $10^{-3}\ \Omega \cdot cm$.

A cluster or groups of clusters are to be combined in matrixes for creating a random-access memory for computers, transformers of video images in to electrical signals, and for a number of other applications as well.

Each cluster may be also connected to at least two control electrodes, an ensemble of such clusters forming a memory cell matrix.

Two control electrodes may be also connected to at least two or more clusters and an ensemble of such clusters forms a memory cell matrix, capable of storing information even at de-energising.

In order for active cells, based on clusters or on complete groups of clusters, could work in an optimum electrical condition, they are to be connected to the supply electrodes through the specially created load in the form of passive resistors or nonlinear elements in the form of the similar clusters.

Thus, clusters may be connected to supply electrodes through a resistive layer or a cluster (non-linear) layer. Using a non-linear load one may easily create logic elements with memory.

Every possible logical elements may be created on basis of group of clusters having resistive or nonlinear loads in the form of proper clusters. One important point to note is, that in this case the parasitic capacitance of driving and supply electrodes, in fact, little influences the temperature parameters of cells, since the electrodes are either missing because of the direct contact of cells, or have minimum dimensions because of proximity of arrangement of the cells. It is possible to add the cells extra functionalities with the help of a preset configuration of supply or control electrodes. This fact considerably simplifies the process of designing of devices.

According to one embodiment two or more clusters are connected to supply electrodes and are arranged in a group in the form of a single layer of clusters directly contacting one another, and one or more clusters are connected to control input electrodes, the other cluster or clusters are connected to output electrodes, forming thereby the output of the logical element <<OR>>.

In another embodiment two or more clusters are arranged into a group in the form of a serial one-dimensional chain, the even elements of which are connected through resistive layers to the first supply electrode, and the odd elements are connected through resistive layers to the second supply electrode, forming thereby a logical shift register.

Clusters and groups of clusters may be arranged by way of direct contacting and joined together by means of electrodes as well.

In one embodiment of the invention two or more clusters are connected to supply electrodes and joined together in a group in the form of a single layer, and one or more clusters are connected to control input electrodes, the other cluster or clusters are connected to output electrodes, the input and output clusters are connected to one another through additional electrodes of the similar thickness and width, the said electrodes may be connected to one or more clusters of the next group. The said solution allows to considerably simplify the design of devices and to create various logic elements on this basis.

In the other variant of ensembling two or more clusters connected to supply electrodes and joined together in a group in the form of one layer, one or more clusters are connected to control input electrodes, and the other cluster or clusters are connected to output electrodes, and besides the input and output clusters are connected to one another through additional electrodes, tapered at one side in the signal direction, the said electrodes can be connected to one or more clusters of the next group.

In this case the directional change of the dimensional of an electrode can create its asymmetric performance in the direction of motion of an electronic ring. This solution allows to provide a design for unidirectional motion of signals and to simplify the technology for manufacturing devices on this basis.

The logical inversion operation may be carried out if the cluster is connected to supply voltage through resistive layer, and the supply point is connected to the output electrode, the input voltage is supplied directly through one or more control electrodes, connected to clusters through the tunnel-transparent gap.

Analogue comparing of two signals may be performed, when two clusters are connected to the supply voltage through resistive elements, and the first input voltage is supplied directly through the first control electrode, connected to one cluster through the tunnel-transparent gap, and the second input voltage is supplied to the second electrode connected to the other cluster through a tunnel-transparent gap, while some of the junction points to resistive elements of each cluster are joined together and the other junction points of resistive elements are connected to output electrodes, forming thereby the outputs of a two signal analogue comparator.

Two clusters may be connected to the supply voltage through resistive elements, and the junction points thereof are connected to output electrodes. In this case the first input voltage is supplied directly through the first control electrode connected to the first cluster through the tunnel-transparent gap, and the second input voltage is supplied directly through the second control electrode connected to the second cluster through the tunnel-transparent gap, the first output electrode is connected to the second cluster through the tunnel-transparent gap, the second output electrode is connected to the first cluster through the tunnel-transparent gap. In this case the said two clusters form a bistable trigger circuit.

Two or more clusters may be connected through the resistive layer to the supply voltage and form isolated groups, united by one common output electrode, and each isolated group of clusters is connected to one or more control input electrodes, and the number of clusters in each group determines the weight function according to the input signal and forming thereby the neurone-type logical component—a weight summator.

Still one more improvement is in one or more clusters being connected to the supply electrodes at least through one additional cluster layer. In this case the additional layer functions as a load providing thereby a possibility for storing the initial state even at power-down.

Two or more clusters are connected to the supply electrodes and joined together in a group in the form of a single layer of directly together contacting clusters, one or more clusters are connected to control input electrodes, and the other cluster or clusters are connected to the output electrodes, forming thereby the output of a logical memory component "OR" with memory.

Two or more clusters may be connected to the supply electrodes and joined together in a group in the form of a single layer, one or more clusters are connected to the control input electrodes, and the other cluster or clusters are connected to output electrodes, and besides the input and output clusters are joined together through additional electrodes of the same thickness and width, and these electrodes can be connected to one or more clusters of the next group. The circuits of the kind may function as a signal amplifier with memory.

Two or more clusters may be connected to supply electrodes and joined together in a group in the form of a single layer, one or more clusters are connected to control input electrodes, and the other cluster or other clusters are connected to output electrodes, and besides input and output clusters are joined together through additional electrodes tapered at one side in the in the signal direction, and the said electrodes can be connected to one or more clusters of the next group. The circuits of the kind may function as a signal amplifier with memory. In this case the tapered electrodes provide the directivity of signal transfer and the cross coupling between the input and the output.

One and more clusters may be connected through additional clusters to supply voltage and form isolated groups, which are combined by a single common output electrode, and each isolated group of clusters is connected to one or more control input electrodes, the number of clusters in the each group determines the weight function according to the input signal, forming thereby a neurone-type logical component—a weight summator with memory.

An important logic operation may be performed, when a cluster is connected through additional cluster to the supply voltage, a junction point is connected to the output electrode, the input voltage is supplied directly through one or more control electrodes, which is connected to the clusters through the tunnel-transparent gap, forming thereby an inversion logical component with memory.

In the further embodiment two clusters are connected to the supply voltage through additional clusters, the first input voltage is supplied directly through the first control electrode connected to one cluster through the tunnel-transparent gap, and the second input voltage is supplied to the second electrode connected to the other cluster through the tunnel-transparent gap, some of junction points of the resistive elements of each cluster are joined together and connected to the supply electrode through the resistive element, and the other junction points of additional clusters are connected to the output electrodes, forming thereby the outputs of the two signal analogue comparator with memory.

Still further improvement is in two clusters being connected through additional clusters to the supply voltage, the junction points thereof are connected to the output electrodes, the first input voltage is supplied directly through the first control electrode connected to the first cluster through the tunnel-trasparent gap, and the second input voltage is supplied directly through the second control electrode connected to the second cluster through the tunnel-transparent gap, the first output electrode is connected to the second cluster through the tunnel-transparent gap, and the second output electrode is connected to the first cluster through tunnel-transparent gap forming thereby a bistable trigger with memory.

When on a film made of clusters are applied electrodes of particular configuration, e.g. in the form of a thin strip or a kite, then the spreading wave of electrons in clusters may be used for recording or reading information. That is, the process goes similarly to propagation of a wave of excitation in a human axon. The devices of the kind are useful for reading video information from photosensitive films or for reproducing video information, e.g. in displays. In this case, due to auto scanning, there is no need for matrix control of reading components or of reproducing components, i.e. luminophors or other optically active materials.

If one or more cluster layers are connected to at least two control electrodes, at least one of which is light transparent, and the spacings between clusters are filled with photosensitive semiconductor, a light-control memory medium is formed. In this case the electrodes may be distributed and reference to the cells may be effected by means of a laser. The medium of the kind may be used in laser discs.

The other embodiment of the invention consists in that one or more layers of clusters are connected at least to two electrodes, at least one of which is light-transparent, and the gaps between clusters are filled with optically active material forming a screen of a display.

Still further embodiment of the invention consists in that one or more layers of clusters are connected at least to two electrodes, at least one of which is a grid, transparent for electrons, and the spacings between clusters are filled with a material with a low work function of an electron in vacuum, forming thereby a source of electrons.

Practically, the layers that consist of clusters and are disposed between electrodes are distributed devices. In the structure of the kind, the energy of the electric field is transformed in to a wave of the electron motion. In case the wave propagates in a restricted space, it is possible to set resonant requirements for motion of such a wave. Hence, it is possible to create a high frequency generator.

According to this improvement, one or more cluster layers are connected to at least two spaced electrodes made in the form of resonator, forming thereby a high-frequency generator with a maximal boundary frequency determined by the formula $$f \leq m_e \alpha^4 c^2 / 2\pi \hbar.$$

As a resonant cell is actually a quantum device, the parameters of this cell are determined by world constants. Hence, there is an opportunity of creating a reference voltage source.

In a still further improvement one or more clusters are combined by direct contacting or are joined together through electrodes and are connected to the voltage supply, at least one of the contacts is connected to the output electrode allowing thereby to form a standard voltage supply with levels $$U = n\alpha^3 c^2 m_e / 2e,$$

wherein n—a number of serially connected clusters.

In order to obtain desired characteristics of the aforecited devices made on clusters, it is necessary to set correctly their operational conditions by selecting the supply voltages (electric field density) and operation temperatures.

The operation process of devices is also characterised in that the field control strength per one cluster is determined in the range, $$E_{min} \leq E \leq E_{max},$$

wherein $E_{min} = m_e^2 \alpha^5 c^3 / 2e\hbar$, $E_{max} = E_{min}/4\pi\alpha$.

The process of operation of the above-described devices is characterised in a possibility of using a continuous and a pulse supply.

The other class of electronic devices in accordance with the further invention comprises the following improvements.

There are a number of materials with exotic electrophysical properties. In these materials electrons have minimum energy, i.e., they have the shape that is close to a ring. Using these materials, it is possible to extend the variety of created electronic devices and to simplify the process of their designing. However, it is necessary to take into account that reducing dimensions of devices to the values less than the size of a ring electron leads to degradation of properties of devices. The requirements to control and supply electrodes of these devices are similar to the requirements disclosed above. As a matter of fact, designing of the devices is similar to the above-stated; therefore it is set forth below without comments.

A quantum-size electronic device comprising electrodes and located between them a layer of material having MSPT in which the layer of material having MSPT is made in the form of clusters, which have the cross-section size determined from the formula:

$$r = ar_0,$$

wherein a is a coefficient determined in the range $2 \leq a \leq 4$, distance between the electrodes being more than $r_0$.

The further improvement consists in connecting the cluster to the supply electrodes and at least one load through tunnel-transparent gaps—to one or more control electrodes, the thickness of tunnel-transparent gaps does not exceed $r_0$ and the distance between electrodes is not less than $r_0$.

Electrodes made of superconductor or material having MSPT may have a cross section size $$d \geq 2 \, r_0.$$

If the electrodes, are made of conductor, the cross size is determined from the criterion $d \geq 2 \, r_0$. Thus, the specific resistance should be not less, than $10^{-3}$ $\Omega$cm.

The clusters may be connected to supply electrodes at least through one resistive layer.

The layer of the kind may be connected to two or more clusters that are connected to supply electrodes and combined into a group in the form of a single layer of directly contacting clusters, and one or more clusters are connected to control input electrodes, and the other cluster or clusters are connected to output electrodes, forming thereby the output of the logical element "OR".

Further improvement consists in that two or more clusters are connected to supply electrodes and joined together in a group in the form of a single layer, and besides one or more clusters are connected to control input electrodes, and the other cluster or clusters are connected to output electrodes, input and output clusters are connected in-between through additional electrodes of the same thickness and width, and besides the said electrodes can be connected to one or more clusters of the next group. The circuits of the kind may function as signal amplifies.

In case of one-directional signal passing two or more clusters are connected to supply electrodes and joined together in a group in the form of a single layer, an besides one or more clusters are connected to control input electrodes, and the other cluster or clusters are connected to output electrodes, input and output clusters are connected in-between through additional electrodes, tapered at one side in the signal direction, and besides the said electrodes can be connected to one or more clusters of the next group. The circuits of the kind may function as signal amplifies with a cross coupling.

If the input voltage is supplied directly through one or more control electrodes connected to the cluster through the tunnel-transparent gap, and besides the cluster is connected through the resistive element to the supply voltage, and the connection point is connected to the output electrode, then it is the output of the logical element "NOT".

For carrying out the operation of analog comparison of two signals, two clusters are connected to the supply voltage through resistive elements, the first input voltage is supplied directly through the first control electrode connected to one cluster through the tunnel-transparent layer, and second input voltage is supplied to the second electrode connected to the other cluster through the tunnel-transparent gap, and besides some of the connection points to the resistive elements of each clusters are joined together, the other connection points of resistive elements are connected to the output electrodes, forming thereby the outputs of the analog comparator of two signals.

One more device according to the invention is made so that two clusters are connected to the supply voltage through resistive elements, and the points of connection thereof are connected to the output electrodes, the first input voltage is supplied directly through the first control electrode connected to the first cluster through the tunnel-transparent gap, and the second input voltage is supplied directly through the second control electrode connected with the second cluster through the tunnel-transparent gap, the first output electrode is connected to the second cluster through the tunnel-transparent layer, and the second output electrode is connected to the first cluster through the tunnel-transparent layer, forming thereby a bistable trigger.

One more variant of development of the invention consists in that one and more clusters are connected to the supply voltage through a resistive layer and form isolated groups combined by one common output electrode, and each isolated group of clusters is connected to one or more control input electrodes, and the number of clusters in each group determines the weight function according to the input signal, forming thereby a neurone type logic element—a weight combiner.

The further improvement consists in that two or more clusters are connected to at least two control electrodes; the spacings between clusters are filled with photosensitive semiconductor, a set of such clusters forming a photosensitive matrix.

In this case a photoelectric signal is stored, when the operation temperature of the device is lower than temperature of the metal-semiconductor phase transition.

The other embodiment of the invention consists in that that one or more layers of clusters are connected to at least two electrodes, at least one of which is optically transparent, and the gaps between clusters are filled with optically by active material forming thereby a display screen.

Still further embodiment of the invention consists in that one or more layers of clusters are connected to at least two electrodes, at least one of which is a grid, transparent for electrons, and the spacings between the clusters are filled with a material with a low work function of an electron in vacuum, forming thereby a source of electrons.

If one or more layers of clusters are connected to at least two spaced electrodes made io in the form of resonator, they form a high frequency resonator with maximum cut-off frequency determined from the formula $f \geq m_e \alpha^4 c^2/h$.

The operating procedure of devices with clusters made of material having MSPT consists in transmitting electric current through at least one cluster, and is characterised in that the current density through cluster is limited by the value $j \leq 4\pi e m_e^3 \alpha^8 c^4/h^3$ If in the cluster are used materials having the temperature of the metal-semiconductor phase transition higher than the operation temperature of devices, then under the invention it is necessary to provide the electric field density per one cluster $E \geq m_e^2 \alpha^5 c^3/2e\hbar$, This condition is optional in case of use in the cluster of materials having the temperature of the metal-semiconductor phase transition lower than the operating temperature of devices.

For a photosensitive matrix the process of operation that comprises transmitting of the electric current at least through one cluster, is characterised in using in the cluster of materials having the temperature of the metal-semiconductor phase transition higher than the operating temperature of devices.

In order to reduce the specific power consumption of electronic devices and integrated circuits it is practical to use superconducting materials working at temperatures above normal (room). Superconductivity of the materials of the kind is stipulated by the special type of pairing of ring electrons, which leads to collapse of phonon interaction with a crystalline grating. The voltamper characteristics of the materials of the kind are reverse to the voltamper characteristics of materials having the semiconductor-metal phase transition. Thus, at the increase of a temperature above the critical temperature, a superconductor transforms into a common semiconductor or conductor. At exceeding the critical temperature, the material with a semiconductor-metal phase transition, transforms into metal conductor. However, its resistance remains final, as the phonon mechanism of interaction of ring electrons with the crystalline grating does not disappear completely. However, the basic requirements to designing on basis of superconducting materials will be similar to the aforedisclosed requirements for devices basing on materials with semiconductor—metal phase transition. In this case works the requirement to the dimensions of electrodes and clusters, which cannot be less than the diameter of a ring electron.

Still further variant of embodiment of the invention consists in that the quantum size electronic device comprising electrodes and at least one cluster located in-between is characterised in that the cluster is made of the material of the superconductor and has the cross section size determined by the formula: $r = a\, r_0$, wherein a—is a coefficient determined within the range $2 \leq a \leq 4$, and besides the distance between the electrode exceeds $r_0$.

The further improvement consists in that the cluster is connected to the supply electrodes and at least one load, and through tunnel-transparent gaps they are connected to one or more control electrodes, and besides the thickness of the tunnel-transparent gaps does not exceed $r_0$.

The device may be additionally characterised in that the electrodes are made of superconductor or of material having MSPT and having the cross section size $d \geq 2\, r_0$.

If the electrodes are made of conductor the cross size is determined from the criterion $d \geq 2\, r_0$. Thus, the specific resistance should be not less, than $10^{-3}$ Ωcm.

One or more clusters according to the improvement may be connected to the supply electrodes at least through one resistive layer.

Through such a resistive layer two or more clusters are connected to the supply electrodes and joined together in a group in the form of a single layer of directly contacting in-between clusters, and besides one or more clusters are connected to the control input electrodes, and the other cluster or clusters are connected to the output electrodes, forming thereby the output of the logical element "OR".

The further improvement consists in that two or more clusters are connected to the supply electrodes and joined together in a group in the form of one layer, and besides one or more clusters are connected to control input electrodes, and the other cluster or clusters are connected to the output electrodes, the input and output clusters are connected in-between through additional electrodes of the same thickness and widths, and besides electrodes can be connected to one or more clusters of the next group. The circuits of the kind may be used as signal amplifies.

To ensure a directed signal passing two or more clusters are connected to the supply electrodes and joined together in a group in the form of a single layer, one or more clusters are connected to the control input electrodes, and the other cluster or clusters are connected to the output electrodes, the input and output clusters are connected in-between through additional electrodes tapered at one side in the signal direction, and besides these electrodes can be connected to one or more clusters of the next group. The circuits of the kind may be used as signal amplifies with input and output cross coupling.

Such an important logic element as an input signal inversion may be created if the input voltage is supplied directly through one or more control electrodes connected to the cluster through the tunnel-transparent layer, the cluster is connected to the supply voltage through the resistive element, and besides the connection point is connected a to the output electrodes, forming thereby the output of the logic element "NO".

According to the next improvement two clusters are connected to the supply voltage through resistive elements, and with this the first input voltage is supplied directly through the first control electrode that is connected to one cluster through the tunnel-transparent gap, and the second input voltage is supplied to the second electrode that is connected to the other cluster through the tunnel-transparent gap, and besides some of the connection points that are connected to the resistive elements of each cluster are joined together, and the other connection points of resistive elements are connected to the output electrodes that are outputs of the comparator circuit of two signals.

If two clusters are connected to the supply voltage through resistive elements, the connection points thereof are connected to output electrodes, and besides the first input voltage is supplied directly through the first control electrode that is connected to the first cluster through the tunnel-transparent gap, and the second input voltage is supplied directly through the second control electrode that is connected to the second cluster through the tunnel-transparent gap, the first output electrode is connected to the second cluster through the tunnel-transparent gap, the second output electrode is connected to the first cluster through the tunnel-transparent gap; the said two clusters form thereby a bistable trigger.

Further one and more clusters are connected the supply voltage through the resistive layer and form isolated groups that are joined together by one common output electrode, and one or more control input electrodes are connected to each isolated group of clusters, with this the number of clusters in each group determines the weight function according to the input signal, forming thereby a neurone-type logic element—a weight comparator.

The operating procedure of the device is determined by that the operating range of devices is limited by critical temperature of the junction in the superconducting state of the used materials, which is determined from the formula $$T_c < m_e \alpha^3 c^2 / 2k\pi,$$

wherein k—is the Boltzmann's constant.

The operating procedure of the devices listed in this variant is characterised in that transition from the superconducting state to the normal sate under the action of the control voltages takes place with the following electric field strength at the cluster $$E > m_e^2 \alpha^5 c^3 / 2he$$

where h=$2\pi\hbar$—Planck's constant.

It is necessary to mark one more advantage, which is common for all the aforementioned devices: all these devices operate at normal temperatures and can operate both with single electrons, and with groups of electrons.

A galvanic cross coupling between different parts is commonplace problem in the process making integrated circuits. For this purpose, it is necessary to create a peculiar transformer with dimensions that are commensurable with the dimensions of the devices, which are made on clusters or on groups of clusters.

It was demonstrated, that in conductors, consisting of materials with semiconductor—metal phase transition, or of superconductors, or of a number of other materials, electrons move as chains, consisting of their ring electrons. If two conductors of the kind are placed close enough, provided the proper conductors are made so that a part of a ring electron extends outside the limits of a conductor, it is possible to get an engagement of ring electrons due to their Coulombian fields. Thus, the motion of electrons in two parallel conductors can be synchronous. This effect can be used for designing transformers and induction logical components.

In this variant the quantum size electronic device comprising electrodes, at least one of which is made of conductor, superconductor or material with MSPT, is characterised by that the electrodes have a cross-section size determined from the formula:

$$d = n_d \cdot r_0,$$

wherein $n_d$—a coefficient determined in the range $1 \leq n_d \leq 2$.

The device is further characterised by that in the area of specified cross size a group of electrodes has at least one near region up to the distance not exceeding $2r_0$, forming thereby a transformer a direct or alternate current.

A linking coefficient of electrons may be changed by changing the distance between the conductors in the transformer or the form of the proper conductors, changing thereby the density of electrons running through the conductors. The effect of the change of the density of electrons in a conductor is the change of the potential on the ends of a conductor. Thus, in this case there may occur an immediate transformation of constant or alternating current, or vice versa.

According to the this improvement of the invention, two electrodes, in the area of the specified cross-section size, have at least two near regions up to the distance not exceeding $2r_0$; a direct current or an alternating current flows through one of the electrodes, the second electrode is connected to the load, forming thereby a dc or ac transducer.

Moreover, when two electrodes have at least two near regions to the distance not exceeding $2r_0$, an alternate current of a specified frequency flows through one of the electrodes, and the second electrode has the configuration corresponding to the said frequency and is connected to the load, then the direct current flows through the load, and the said device forms an ac-to-dc transducer.

If at least one electrode has periodic regions of a diversion from the specified size of an electrode (taper/expansion) and has at least two near regions up to distance not exceeding $2r_0$, and at least one of the electrodes is connected to a load, then the device forms a transformer of the current form.

Manufacturing really high-temperature superconductors working at the temperature from 30 up to 93.5° C. is an extremely actual problem for both electronics and for energetics. Experiments demonstrate that high-temperature superconductivity very often occurs in particular materials made as clusters, including micrometer-sized clusters. The clusters in the form of pressed dusts or ceramics exhibit a high-temperature superconductivity up to normal temperatures. However, this superconductivity is extremely unstable and promptly disappears. The proposed invention allows to explain the mechanism of superconductivity and to create stable high-temperature superconductors.

In order to provide a stable superconductivity, it is necessary that the size of the cross-area of electron motion was not less than the diameter of a ring electron $2r_0$. In this case the length of the area of a superconductivity is formally unrestricted by anything. Hence, it is possible to create long conductors—"whiskers" of nanometer thickness. Wires may be made by coating the said conductors by a protective covering and combining them in cord assembles. Energy stores or constant magnets with a big field may be made by making these wires in a ring or a coil.

According to the invention, a quantum-size electronic device comprises a superconducting element. In this case the superconducting element should have the cross size, defined from the formula $D = a\, r_0$, wherein a is a coefficient, defined as $a > 2$.

In the other improvements the superconducting material comprises one or more clusters integrated in a group in the form of a series chain and connected to supply electrodes. In this case the size of a cluster should be not less than $2r_0$.

The superconducting material may also consist of one or more clusters integrated in the form of one or more layers and connected to the supply electrodes. In this case the size of a cluster should be not less than $2r_0$.

The superconducting device may be made of high-molecular organic material containing donor electron centers.

The superconducting material may be also made in the form of a capillary cavity with a covering containing donor electron centers, the size of the cavity not exceeding $2r_0$.

The superconducting material may be also made in the form of a semiconductor containing donor electron centers. In this case the distance between the donor electron centers is selected from the requirement $d < 4r_0$.

One of the improvements of the invention consists in that all the cited superconducting elements may be made in the form of a ring or a solenoid.

The operation process or the operation conditions of high-temperature superconductors consist in the following. The working range of wires and the devices on their basis is limited by the critical temperature of transition of the used materials into a superconducting state. The said temperature is determined from the formula $$T_c < m_e \alpha^3 c^2 / (2k\pi).$$

The other operation condition consists in that the transmission of an electric current through at least one cluster or conductor generally is restricted by the current density $$j < 4\pi e m_e^3 \alpha^8 c^4 / h^3.$$

A still further operation condition consists in that that the working range of devices is limited by a critical magnetic field of transition of used materials into a superconducting state. The said temperature is determined from the formula $$B_c < (m_e/e)[m_e(\alpha^2 c)^2 / \hbar].$$

All the itemised devices are illustrated below by the following examples that are depicted in the drawings.

BRIEF DESCRIPTION OF THE DRAWINGS

FIG. 1. Spherical logic cell.

FIG. 2. Spin configurations of paired ring electrons in the spherical logic cell. (The arrow indicates the direction of the ring current).

Figure 3:
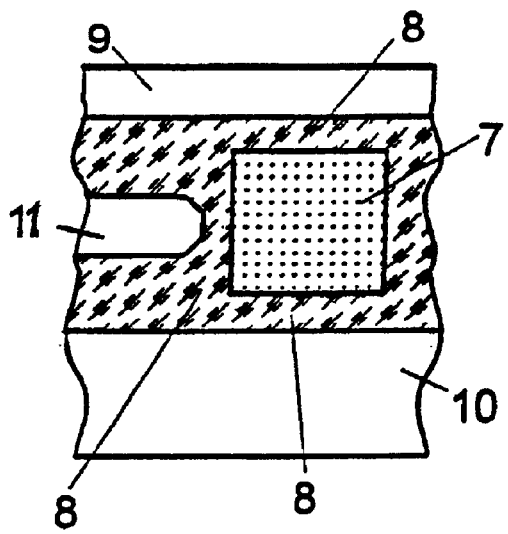
FIG. 3. Cylinder logic cell.

The aforesaid devices may be classified and described as follows:

Resonant electronic devices.

As a matter of principle it is possible to design any artificial defect that may be a certain resonator for a ring wave with a radius $r_0$ and an effective quality factor $1/\alpha$.

FIG. 1 presents a spherical logic cell. 1 is the cluster nucleus; 2 is the tunnel-tnansparent enclosure; 3,4 are supply electrodes; 5,6 are control electrodes. Actually, a nucleus may be made of any material—metal, semiconductor, superconductor, material with MSPT, high-molecular organic compound or be a mere empty cave—a bubble. The main thing is that the nucleus radius had dimensions aliquot $r_0$. The cluster enclosure may be made of any dielectric or semiconductor and have a single- or multilayer structure. The thickness of the envelope generally should not exceed $r_0$. The said cluster can be connected to the supply electrodes 3, 4 and control electrodes 5,6. With this, one or two electrons in various spin configurations may be present at the nucleus. FIG. 2 shows spin configurations of paired ring electrons in a spherical logic cell. The arrow direction shows the direction of the ring current.

Taking as an example the cell of FIG. 1 it is possible to determine optimal design characteristics, which may be applied also to the other electronic quantum size devices considered below.

Thermodynamic stability of a ring electron is found from the kinetic equation of movement of a spaced ring mass speeding at $\alpha^2 c$. In this case we take the effective electron mass for $m^* = m_e/\alpha$, then the critical temperature up to which the existence of a ring electron is possible may be expressed as follows:

$$T_e = m_e(\alpha^2 c)^2/(2k\alpha) = 1151.86 \text{ K}(878.71° \text{ C.}) \quad (7)$$

It is characteristic that temperatures of phase transitions of the first and the second order in some materials correspond to the critical temperature, e.g. the upper limit of semiconductor-metal phase transitions [16, p.4]: $MoTe_2$, T≅1053 K (780° C.); $NbO_2$, T≅1070 K(797° C.); $FeSi_2$, T≅1123 K (850° C.) etc. An exception is rather only $ZrO_2$, T=1273÷1443 K, (1000÷1170° C.), probably due to the presence of two modifications of the crystal latitude. The upper limits of phase transitions of the second kind lie close to this temperature, e.g. ferromagnetics in the paramagnetic state and anti-ferromagnetics in the state of magnetic disordering.

Let us determine energetic characteristics of a cell. The equations (5) and (6) show that when two rings approach at the distance $\leq r_0/\sqrt{2}$ there may be created a pair with a maximum energy:

$$W_1 = (8/27)e^2/(4\pi\epsilon_0 r_0) \quad (8)$$

At a transverse orthogonal overlap of two rings having a common centre the energy maximum is:

$$W_2 = (1/4)e^2/(4\pi\epsilon_0 r_0) \quad (9)$$

The bounding energy $W_1$ corresponds to the phase transition temperature $T_1 = W_1/k = 8/27 T_e = 341.3$ K (68.3° C. This magnitude perfectly corresponds to the experimental temperature of a lightly smeared centre of the phase transition in $VO_2$, $T_n = 340$ K (67° C.). Bounding energy gives a good characteristic to the $V_2O_3$ system. The temperature of the beginning of the phase transition will be $T_2 = 1/8\ T_e = 144$ K (−129° C.) (during the experiment T=145 K (−128° C.) [16]). Energy state of the bound electron pairs may undergo changes only with multiplicity of a rational number—$n = n_1/n_2$, where $n_1, n_2$—are natural integer numbers and $n_2 \neq 0$. By changing multiplicity of the distance between electron rings with provision for vanadium oxides forming Magneli series $V_nO_{2n-1} = V_2O_3 + (n-2)VO_2$, it is possible to determine to high precision all temperatures of metal-semiconductor phase transitions of the series.

Similarly the temperature of metal-semiconductor phase junctions for any material may be theoretically determined.

As it follows from theoretical and experimental data for metal-semiconductor phase transitions, ring electrons may be condensed into drops at various space configurations of their magnetic moments—spin. Unlike bound electron pairs in atoms, having only 4 spin states: ↑↑,↓↓,↑↓,↓↑, ring electrons may have additional states: ↑→,↑←,↑/, and etc. Moreover, these states a ring allows discrete compression into a ring with a smaller radius (FIG. 2a) or directly into an ellipse. (FIG. 2b). It is important that at maximum compression of two ring-like electrons, their spins will be directed ↑, ↓, ↓, ↑, and rings must transform into ellipses with a maximum size of semiaxis $$d_n = r_0\left(2 - \frac{1}{\sqrt{2}}\right) = 9.3755 \text{ nm.}$$

Hence, the maximum size of a cluster nucleus will be as follows: $d_{max} = r_0(4-\sqrt{2}) = 18.75$ nm. With this the configuration of electrons will have a form of orthogonal inter-crossing ellipses, and besides one of the ellipses passes through focuses of the second ellipse (FIG. 2b). There is a probability of joining together electrons without compressing them into an ellipse, obtaining thereby a nucleus $d = 2r_0$ (FIG. 2c).

Naturally, the maximum size of a pair of rings at ↑→ will be at their coaxial inter-crossing $d=3r_0$ (FIG. 2d), and at a bounding through the surface of rings—$d=4r_0$(FIG. 2f). By adding an enclosure with a thickness $r_0$ we shall get the maximum cell size $5r_0 = 36.26$ nm.

Now let us determine the conditions to the minimum cell size. We allow the condition of the cell located on a substrate being heated to at least a normal temperature.

It is shown in [1, p.20], that even at sizes of an order 2–10 nm, phase and structural transformations of clusters start to differ from the bulk material. At smaller sizes the melting temperature of particles reduces and the crystal structure thereof changes as well. At the same time may increase the mobility of cluster on the substrate surface and a coefficient of diffusion of the cluster material into the bulk of the substrate material. In order to reduce the thermodynamic unsuitability, i.e. cluster fusing at the elevated operating temperatures; the atom binding energy in the cluster or the energy of the phase transition of the cluster material should be not less than 5 kJ/mol.

The other criterion limiting the minimum size of cluster may be found from the condition of compression of the electronic ring by factor of 2,3,4 and more. Namely, de Broglie wave function will have the second and higher modes, i.e. harmonics. Then $r_0^* = r_0/n$, and at n=2 the ring diameter will decrease to 7.25 nm. But as it was shown above upon decreasing the distance between electrodes <8 nm there appears the short-circuit <<tunnel>> current. Therefore there is no physical sense in reducing the cluster size to less than 7.25 nm, and to diminishing the distance between control and supply electrodes to less than 7.25 nm.

Hence, the size of 7.25 nm is the fundamental limit of nanoelectronics.

Taking into consideration the aforesaid let us select the operation dimensions for an elementary logic cell in the range: 7.25 nm$\leq$d$\leq$36.26 nm Beside the centrally symmetric configuration there may be designed axisynimetric configurations of clusters that will also have resonance features and form ring electrons.

FIG. 3 shows a planar modification of a logic cell—a cylinder logic cell, wherein 7 is cluster-nucleus; 8 is a tunnel-transparent enclosure; 9,10 are supply electrodes; 11 is a control electrode.

Here the function of the nucleus—resonator plays a cylinder-like channel 7 directly built in a dielectric or a large-gap semiconductor, and functioning as an enclosure 8. Moreover the channel may be filled with any metal, semiconductor, superconductor, and high molecular compound, material with MSPT or partially filled with residual gases. Supply electrodes 9, 10 and control electrodes 11 are connected to the channel. It is important that the materials were thermally and chemically resistant, i.e., processable. Besides, they should not form additional defects scattering one or two ring electrons during their movement around the nucleus. Dimensional requirement towards axisymmetric cells somewhat differ from that to centrally symmetric cells. The minimum diameter of the cell nucleus is $2r_0$, and the maximum should not exceed $4r_0$. Such cells may contact one another through tunnel-transparent gaps having a maximum size not more than $r_0$ and form periodic structures extending both parallel to the axis and along the axis.

Figure 4:
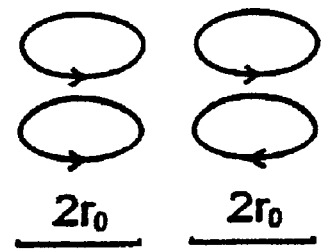
FIG. 4. Spin configurations of the paired ring electrons in the cylinder logic cell.

Axisymmetric configurations may have both orthogonal-spin (OS) pairing of electrons of the types as shown at FIG. 2 and parallel pairing and forming chains. FIG. 4 shows spin configurations of paired ring electrons in a cylinder logic cell. The arrow indicates the direction of the ring current.

General requirements to constructive materials are defined below.

It is a common knowledge that compounds of transient metals have a variable valence. Higher oxides of such metals as Ti, V, Nb, Mo, W at deviation from stechiometry, for example in oxygen deficiency, rather then point defects form new homological Magneli series: $M_nO_{2n-1}$, $M_nO_{3n-1}$, $M_nO_{3n-2}$, where n=1,2,3 . . . etc. [16, p. 48]. Besides, the said metals form compounds, having MSPTs at temperatures higher than normal. For example, $NbO_2$, $T_k$=1070 K (797° C.); $V_3O_5$, $T_k$=450 K (177° C.); $Ti_2O_3$, $T_k$=600 K (327° C.); $Ti_3O_5$, $T_k$=448 K (175° C.); $ZrO_2$, $T_k$=1273 K (100° C.). Hence, such materials are extremely advantageous in designing enclosures. Moreover for designing a nucleus it is possible to use other materials, having a high temperature of metal-semiconductor junction: $MoTe_2$, $T_k$=1053 K (780° C.); $FeSi_2$, $T_k$=1123 K (850° C.).

Parallel-spin electronic devices.

Figure 5:
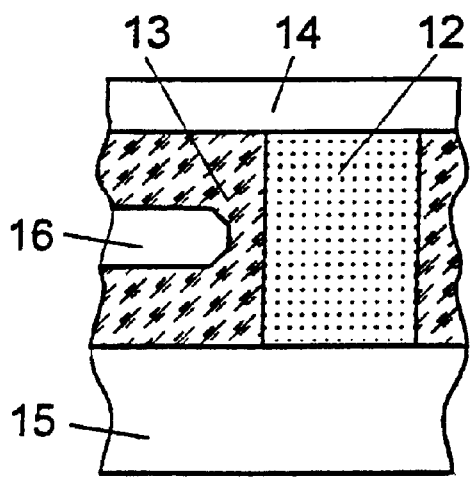
FIG. 5. Cylinder logic cell basing on the material with MSPT.

In a number of embodiments it is possible to make a direct use of the characteristics of the proper material avoiding creation of an artificial cluster formation that initiates formation of a ring electron. For example, a ring electron automatically appears in materials with MSPT. An elementary logic cellon basis of such material is shown at FIG. 5. In this cell a channel of material 12 with MSPT functions as a nucleus, 13 is a tunnel-transparent gap; 14,15 are supply electrodes; 16 is a control electrode. The radius of such a nucleus-channel is within a range $r_0$ to $4r_0$. Similar to the previous cases the distance between the electrodes should not be less than $r_0$. The distinctive feature of this kind of the cell is lack of tunnel-transparent gaps between supply electrodes. Such a medium is not able to store information. But the size of the channel along the axis is not limited what is useful in many applications, for example in integrated circuits with a complex topology.

Figure 6:
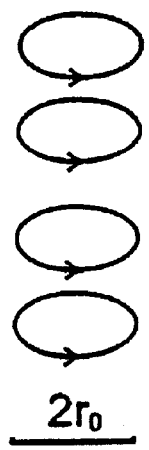
FIG. 6. Spin configurations of paired ring electrons in a cylinder logic cell on basis of material with MSPT.

In case of an extended axisymmetric cell, ring electrons may both form pairs and chains of the type ↑↑↑↑↑↑. FIG. 6 presents spin configurations of paired ring electrons in a cylinder logic cell on basis of material with MSPT. The arrow indicates the direction of the ring current.

This type of condensation of ring electrons will be named 'parallel-spin condensation' (PS). In this chain distances between separate ring electrons will not exceed $r_0/\sqrt{2}$. The chain performs charge transport between supply electrodes 14,15 (FIG. 5). Current is controlled by a control electrode 16, which is connected to the nucleus-channel 12 through the tunnel-transparent dielectric enclosure 13. Actually, such a structure is a quantum-size analogue of a field transistor with coherent electrons.

During experiments such chains of ring electrons are observed in the form of current filamentary nanopaths at field breakthrough phenomenon in thin films. The breakthrough leads to formation of S-shaped volt-amps diagrams and has a number of technical applications [16,15]. However, the prior art described hitherto the formation mechanism of S-shaped characteristics basing on thermodynamic instability appearing in the hysteresis loop due to lattice strain at the temperature metal-semiconductor and semiconductor-metal transition. But this explanation does not allow describing certain experimentally measured low temperature of the proper filament path, which is lower than the temperature of phase transition material. In case of our model the temperature of the filament path is determined from the condition $T_e/n$, where n—is a number of ring electrons forming the said path. Thus, the more ring electrons participate in forming the filament path, the lower is the effective temperature thereof.

In known technical applications, high overworks are generally created on films with MSPT, thus, naturally raising thereby the temperature of the filament path above the temperature of the phase transition of the material. This, in turn, leads to overheating of the material and increasing the time of switching the device due to temperature relaxations.

Thus, taking into consideration specialities of forming the current nanopath, the critical parameters and the operating conditions, it is possible to design a speed device free of any temperature relaxation and having a high reliability due to the absence of re-crystallisation and a temperature breakdown of the material.

Figure 7:
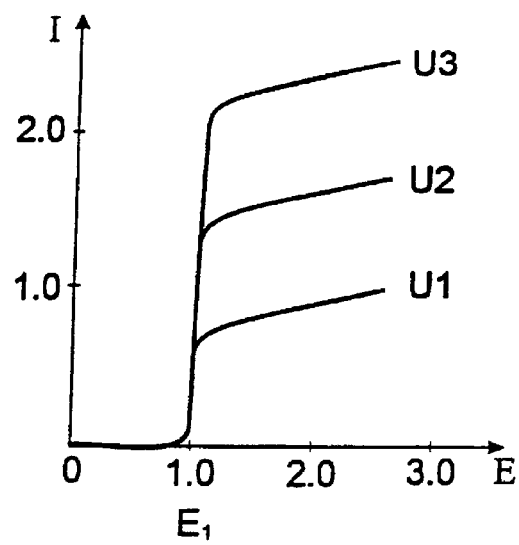
FIG. 7. Graph of current against strength of the electric field for a cylinder logic cell on basis of material with MSPT.

FIG. 7 shows a graph of standard current/electric field strength ratio for a cylinder logic cell on basis of material with MSPT. The scale of current values and field strength is shown in conditional units. $E_1$ is a threshold strength, $U1<U2<U3$ is the voltage at the control electrode 16 (FIG. 5). The passage of current through the channel is possible only after crossing the field threshold $E_1$. After the channel <<breakdown>> the channel current is controlled by the electrode 16, what is reflected at the diagram as a family of characteristics at different values of U. If a device operates at temperatures higher than MSPT, than the channel material is in the metal phase and $E_1$ is near null. But with this metal phase is not a classical metal and it does not screen the electric field of the control electrode 16 due to the specific configuration of ring electrons. Hence, this case makes possible gaining an effective control of the current flowing through the channel.

Antiparallel-spin electronic devices.

Figure 8:
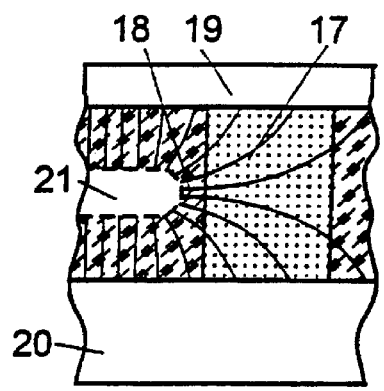
FIG. 8. Cylinder logic cell on basis of superconductor.

Under determinate conditions and in certain materials ring electrons may pair into chains with opposite spins of the type ↑↓↑↓↑↓ . . . This state will be further refereed to as antiparallel-spin state (APS). In this phase are met all main and sufficient conditions for formation of superfluid quantum liquid: pulses of electrons (of current and field) are directed oppositely and the whole chain forms a space-coherent periodic function. It should be specially noted that in this case paired electrons interact with one another due to electromagnetic fields at the near-light speed. Logic cells with hysteresis characteristic may be formed on such materials. FIG. 8 shows a cylinder logic cell on basis of superconductor, where 17 is a cluster on basis of superconductor, 18 is a tunnel-transparent layer, 19,20 are supply electrodes; 21 is the control electrode.

Figure 9:
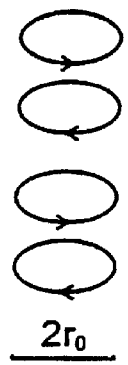
FIG. 9. Spin configurations of paired ring electrons in the cylinder logic cell on basis of superconductor.

FIG. 9 shows spin configurations of paired ring electrons in a cylinder logic cell on basis of superconductor. The arrow indicates the direction of the ring current.

Figure 10:
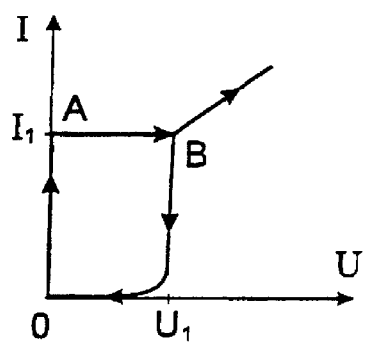
FIG. 10. Current-voltage diagram of cylinder logic cell on basis of superconductor.

FIG. 10 shows the voltage-current characteristic of the cylinder logic cell on basis of superconductor. The current scale is denoted in conventional units. $I_1$—is a critical current of superconductor; $U_1$—is a threshold voltage.

In essence this cell repeats the structure of the cell made of material with MSPT. Here there are no tunnel-transparent layers between supply electrodes, and the cell is controlled through the tunnel-transparent layer 18 (FIG. 8) of thickness not more than $r_0$. Though the material of the channel 17 is in the superconducting phase, the electric field with control electrodes 21 penetrates therethrough due to the specific configuration of ring paired electrons. In this case using the field it is possible to control the critical current of superconductor, i.e. to get a certain quantum-size analogue of a superconducting field transistor. The cell should be supplied by a current source. The voltage drop at the cell will be equal to 0. At reaching the critical current $I_1$ (point A) the cell state changes from superconducting state to the resistive state (point B). The characteristic remains resistive at further voltage gain. At further loss of voltage at the hysteresis loop it returns to the original location. As shows the provided hysteresis loop it fully corresponds to volt-amps diagram of superconducting devices widely used in cryotechnics, for example on basis of thin superconductor filaments [14], though having the additional function of the critical current control by means of the control electrode.

A great number of logical elements on basis of superconductor devices are investigated in [14]. They are non-topical now because of low-temperature operating conditions thereof. Under our assumptions there is a possibility to give the second birth to this class of devices by bringing them to normal temperatures.

At present the superconductor physics is in a critical state. All known superconductivity models could not predict the discovery of high temperature superconductors in 1980s. After the said discovery considerable efforts were made in attempting to design new models of superconductivity, but no adequate models were found. The incorrectness of these models will be considered further.

The modern superconductivity theories, e.g. the Bardeen-Cooper-Schrieffer theory, are based on the phonon action of at large distance paring. However these theories assume that interaction of electrons by means of phonons goes with a perpetual speed. [13,p.287.], i.e. there is no retarded multiplier in the Hamiltonian function. Hence it is impossible to determine the electron speed in the superconducting phase. An unlimited speed of interaction results in violation of energy conservation law.

It is obvious, that the violation of conservation laws reveals the inconsistency of the theory. Therefore, basing on the theory it is impossible to predict any parameters of materials and their operation conditions.

In our case the speed of electron movement is limited by the value of $\alpha^2 c$, corresponding thereby to the energy conservation law.

A turn of electron spin will change the energy of the system. The bonding energy in APS-phase will be lower than the binding energy of ring electrons in PS-phase by the magnitude $1/2\pi n$. Taking into consideration that the charge of the pair is 2e, the critical temperature is found from (7) according to the formula: $T_c=2T_e/2\pi n$. Eventually we get the final formula for finding the critical temperature high-temperature superconductors:

$$T_c=m_e(\alpha^2 c)^2/(2k\alpha\pi n) \qquad (10)$$

An experiment and absence of arbitrary and empirical correction factors in equations are the criteria for estimation reliability of calculations obtained from the theory. The equation (10) consists only of fundamental physical constants, and the calculations made according to it agree with the reference experimental data, demonstrating thereby the high reliability of proposed model. The ion mass of the crystalline grid is absent in the equation (10), and this fact shows that there is no phonon mechanism for interaction with the grid for high-temperature superconductors.

The maximum critical temperature accessible in high-temperature superconductors will be at n=1 and will form $T_{c1}$=366.65 K (93.5° C.). This temperature conforms, e.g. powdered superconductors on basis of $xCuBr.CuBr_2$—the experiment gives a temperature of the order 365 K (92° C.) [31]. Micron powders on basis of Y—Ba—Cu—O composition have a critical temperature of the order 300 K (27° C.) [32]. Similar effects were found in many powder materials of the said class. [33]. Micron regions of the surface of oxide polypropylene films have the critical temperature of the order 300 K (27° C.) [34].

Temperature n=2, $T_{c2}$=183.2 K (−89.95° C.) corresponds to powders on basis of system $C_{60}/Cu$ in respect of 7/1 (the experiment gives the temperature of the centre of the smearing transition of the order 185 K (−88° C.)[35].

Temperature n=4, $T_{c4}$=91.66 K (−181.49° C.) corresponds to the majority of adiscovered at present high-temperature superconductors of the $YBa_2Cu_3O_7$ type. For monocrystalline samples of such ceramics many authors report the experimental critical temperature equal to 91.6 K (−181.55° C.)[36]).

Temperature n=16, $T_{c16}$=22.92 K (−250.23° C.) conforms the critical temperature 200 nm of $Nb_2Ge$ films $T_c$=23.2±0.2 K (−250.15° C.) [37,p.267].

Temperature n=32, $T_{c32}$=11.46 K (−261.69° C.) conforms a large number of low-temperature superconductors of the second order of the $Y_2C_3$, NbC, $Nb_3Au$ type, etc. [37]. In essence all the aforementioned superconductors have one common feature, and namely, they are superconductors of the second order on ring electrons.

Accordingly, the cited data are the best proof for existence of ring electrons.

In should be noted that in low-temperature superconductors of the first order on basis of monomaterials electron bounding with the lattice differs from that of the aforementioned However,they are of no practical importance for quantum size devices. The distinctive features of such interaction will be described in further publications.

Only materials that are superconductive at the temperature $T_{c1}$ have practical importance for designing nanoelectronic devices. Creating such materials is of especial importance also for use in power engineering. Therefore the present specification comprises no know-how disclosure of art of manufacture of such materials. However it is really possible to create nano-sized devices as well as supply and control electrodes therefore on basis of the aforementioned powder materials with high-temperature superconductivity.

Further development of growing process for large amounts of the high-temperature superconducting materials of the kind has the especially important value for use in energetics as well.

Selection of a logic cell performance

A model of ring electron describes OS-, PS- and APS-electronic devices. Accordingly performance analysis is similar for all of such cells. The energy of forming a ring electron from bound states, i.e. the energy that is necessary for an electron transition from the electrode and current into the nucleus region will be determined by the expression:

$$\alpha e U_e = m_e(\alpha^2 c)^2/2 = 1,16 \cdot 10^{-22} \, J, \tag{11}$$

what corresponds to $U_e$=0.09928 V. At pairing of electrons in OS-phase the energy will be identical to $2U_e$=0.19856 V. As electrons in the APS-phase are turned versus one another by $\pi$, the threshold voltage at the superconducting cell is even to $U_1=U_e/\pi$=0.0316V. This voltage complies with the threshold energy of electron bounding in any superconductors $\leq$31.6 meV. This is supported by experimental data, obtained, e.g. regarding the energy of electron bounding in $YBa_2Cu_3O_7$ superconductors about 30 meV [38]. As the space separates, the bounding energy of a pair of electrons in APS-phase will correspond to the definite discrete energy levels n, i.e. $U_1/n$. For example the best NbN/MgO/NbN superconduictng device gives a threshold voltage (value of the energy gap band) 5.3 mV [39]. In our case this corresponds to n=6, i.e., 31.6 mV/6=5.266 mV.

The rotation frequency of an electronic ring:

$$f_e = \alpha^2 c / 2\pi r_0 = m_e(\alpha^2 c)^2 / h = 3.5037 \cdot 10^{11} \, Hz. \tag{12}$$

To this frequency will correspond the maximum possible frequency of OS- and PS-phase generators.

The time for departure by an electron of the nucleus cell at supply of the external field will be equal to one turn thereof, i.e. $\tau_e = 1/f_e$, and, hence, the maximum current through one element:

$$I_e = ef_e = em_e(\alpha^2 c)^2/h = 5.6 \cdot 10^{-8} \, A. \tag{13}$$

Considering that an average radius of a cluster is $\approx 2r_0$, we find the current density at 1 cm² of a surface of densely packed cells:

$$j_e = I_e/(\pi r_0^2) = 4\pi e m_e^3 \alpha^8 c^4/h^3 = 3.4 \cdot 10^4 \, A/cm^2. \tag{14}$$

The maximum required at the cell field strength, capable of switching it into another state is:

$$E_e = U_e/r_0 = m_e^2 \alpha^5 c^3/2e\hbar = 1.37 \cdot 10^5 \, V/cm. \tag{15}$$

The resistivity of a cell is:

$$R_e = U_e/I_e = h/2e^2\alpha = 1.768 \cdot 10^6 \, \Omega, \tag{16}$$

that is of 137.036 higher than the Josephson resistance. The critical magnetic field of such ring current is:

$$B_e = m_e \omega_e/e = (m_e/e)[m_e(\alpha^2 c)^2/\hbar] = 12.5 \, T. \tag{17}$$

The magnetic flow is equal to:

$$\Phi_e = \pi r_0^2 B_e = h/2e = \Phi_0 = 2.0678 \cdot 10^{-15} \, Wb, \tag{18}$$

that is accurate to the quantum of the magnetic flow.

The cited expressions describe phase changes of the first and second order in critical points (singular behaviour) in condensed substances. The aforecited expressions show that they are comprised only of common constants and determine the maximum permissible characteristics of any high-temperature electronic quantum size devices produced of any solid-state materials.

An axissymmetric logic cell consisting of a high-temperature superconductor may be presented as a conductor of large extension. The superconductor of the kind may be used for gross capacity transmitting as well as in the closed form for gross capacity accumulating or for designing solenoids.

Basic requirements for high-temperature materials used in energetics differ from the requirements used in nanoelectronics. This is first of all, high operation temperature, high critical currents and magnetic field, manufacturability, low cost and availability. These criteria meet materials on basis of amorphous and polycrystallic semiconductors consisting of carbon, silicon, oxides of metals and chalcogenides, high molecular compounds, fibers. In order to obtain a limiting critical temperature of 93.5° C. (formula (10)), it is necessary, that the size of a conductor (the area of the electron motion) was not less than the size of a ring electron $2r_0$=14.50 nm (formula (4)).

The area of the electron motion may correspond to represent a chain of clusters; the spacing between the centers of clusters should not exceed $4r_0 \geq \Box 29.0$ nm.

Basically, as regards superconducting materials, the proper material in the area of the electron motion is not of great importance, since the electron interacts not with the grid, but only with particular defects. The way of rectifying the defects is a separate problem. It is simple to use materials free of these defects.

It is important that amount of free electrons, on which the ring electrons may be diffused, did not exceed some critical value. That means that the material should be a semiconductor at normal temperatures, including materials on high molecular compounds. A semiconductor may be natural semiconductors and dielectrics, high molecular compounds, metal doped proteins, etc. The distance between clusters of metal or even between separate atoms of metal in the area of motion of ring electrons should be not exceed $2r_0$. The distance will be optimal, when the clusters will be located in the region $r_0/\sqrt{2}$, i.e. the ring electron can simultaneously reach two neighboring clusters. In this case the technological dispersion of clusters relative the symmetry axis of the semiconductor will not produce a breakage of the area of the electron motion.

The superconducting channels should be protected by a covering, and the wires of the kind should be combined in assemblies. The current lines from ring electrons in such assembles will repel among themselves due to the electromagnetic interaction between them, i.e. due to Lorentz's force. For neutralization of this force it is necessary to use the known mechanism of a pinning, i.e. the mechanism for holding of Abrikosov's vortexes on defects. In our case, the surface of the covering functions as a defect.

Naturally, the thickness of the area surrounding the superconducting channel should not be large, since the area limits the average current density. If all specified requirements will be met for the superconductor of the kind, it is possible to receive a limiting current density, $j_e \leq 3.4 \cdot 10^4$ A/cm² (formula (14)), and a critical magnetic field $B_e \leq 12.5$ T (formula (17)).

Using the cables of the type it is possible to transmit the energy of the order $3.4 \cdot 10^8 - 3.4 \cdot 10^9$ W/cm², and to design electromagnets, the characteristics of which are highly competitive with that of electromagnets based on known low-temperature superconductors (field 6–9 T), e.g. for vehicle on magnetic suspension.

As it is shown above, the maximum speed of a ring electron in a condensed medium does not exceed the speed $\alpha^2 c$. Right this speed is the limit of existence of a ring electron of the maximum size. Absolutely, it is possible to design electronic devices having speed of carriers higher than $\alpha^2 c$ or higher than the maximum sound speed in condensed materials—$\upsilon_{max}=3\alpha^2 c/(\sqrt{2\pi})$. However in this case ring electrons wrap up to atomic sizes. Their energy increases up to the energy of electrons at the Fermi level what leads to the increase of the cross section of interaction of electrons with the lattice by factor of $1/\alpha$. This naturally leads to the excess heating of devices thus limiting their use in superlarge integrated circuits.

It is important, that by changing the dimensions or the material of the electrodes that feed to the cluster signals and power, it is possible to change the current-voltage characteristic of devices by optimizing them for specific applications. However, in this case the ring electron may only be compressed up to the smaller sizes, which naturally will involve drop of operation temperatures. In a number of cases a temperature reserve may be sacrifice for the sake of gaining new current-voltage characteristic. However, in any case the specific concentration of carriers in conductors should be large enough, and it may be determined from the condition $\rho \leq 10^{-3}$ $\Omega \cdot$cm.

In order to support the theoretical data there were designed two kinds of OS-electronic cells.

Figure 11:
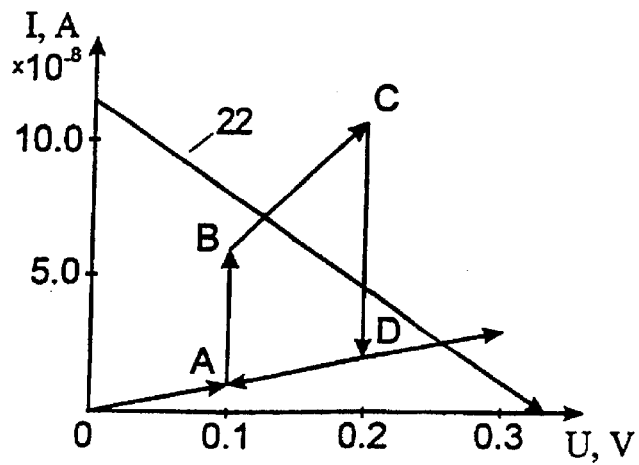
FIG. 11. Experimental current-voltage diagram of the spherical logic cell.

First variant $ZrO_2$. Hollow spheres of an average hollow radius of the order $r_0$ and the thickness of the enclosure $r_0/2$ were plasma deposited on a metal substate as a single layer with minor addition elements. As a result we get an analogue of the cell on FIG. 1. Spheres having diameters being maximal close to $3r_0$ were selected by a scanning tunnel microscope with the needlepoint of a radius of the order $r_0$. The maximum Q-factor of the hollow-resonator equal to $1/\alpha$ was determined according to the maximum change of the tunnel current. This Q-factor complied spheres having the nucleus of the diameter $2r_0$. The volt-amps diagram of such a cell was taken by changing the needle voltage. FIG. 11 shows an experimental volt-amps characteristic of a spherical logic cell, where 22—is a resistive load. The starting segment of volt-amps diagram from 0.0 V to 0.1 V (point A) corresponds to parasitic loss currents of the cell enclosure dielectric. This is due to the fact that the microscope was operated at the room atmosphere with the end humidity and at normal temperature. At gaining the voltage value of 0.1 V the current increased abruptly (up to point B) what corresponded to formation a ring electron around the nucleus. At further voltage increase the current was growing due to the passage of ring electron through the cell (line BC). Thus, electrons unwrapping to their maximum sizes are constantly coming from the metal of the substrate through the tunnel-transparent enclosure into the region of hollow-nucleus. Further ring electrons flow through the tunnel-transparent enclosure into the microscope needle, where they unwrap anew to the sizes-determined by the characteristics of needle material. The current increase is in direct ratio to the voltage increase at the needle. In this case the control electrode is absent.

At the gaining at the needle of the voltage 0.2V (point C) current falls (point D) up to the value of the loss current, determined by the dielectric, forming the cell enclosure. Actually orthogonal pairing of two ring electrons takes place at the voltage 0.2 V as the energy 0.2 eV is the threshold energy of forming the shared potential hole thereof. At this parameter the cell may operate as a logic memory at the external maintaining voltage 0.1V<U<0.2V (segment AD). At these parameters the cell practically drains no energy except the energy determined by the parasite leakage current.

At the voltage increase of more than 0.2 V, the current passing through the cell will be determined yet by paired electrons—electronic drops and will continue increasing at a lower slope in a direct proportion to the voltage.

At decrease of the voltage to null the cell discharges and is ready to work again.

Second variant. In order to test possibilities of logic cell operation in photosensitive matrixes there was designed a cell in a photosensitive semiconductor.

Atoms of transition metals were particularly injected into an n-Si substrate. At concentrations of $10^{18}$–$10^{20}$ cm$^{-3}$ and special anneal parameters clusters with nuclear size close to the radius $r_0$ were formed in the said supersaturated solution. Then the substrate surface was coated by semitransparent electrodes and thereafter volt-amps diagrams were taken. The area of a single electrode was 100 $\mu$m$^2$; i.e. such an electrode overlapped together a group of clusters. The measurements were tested at normal temperatures in absence of illumination.

Figure 12:
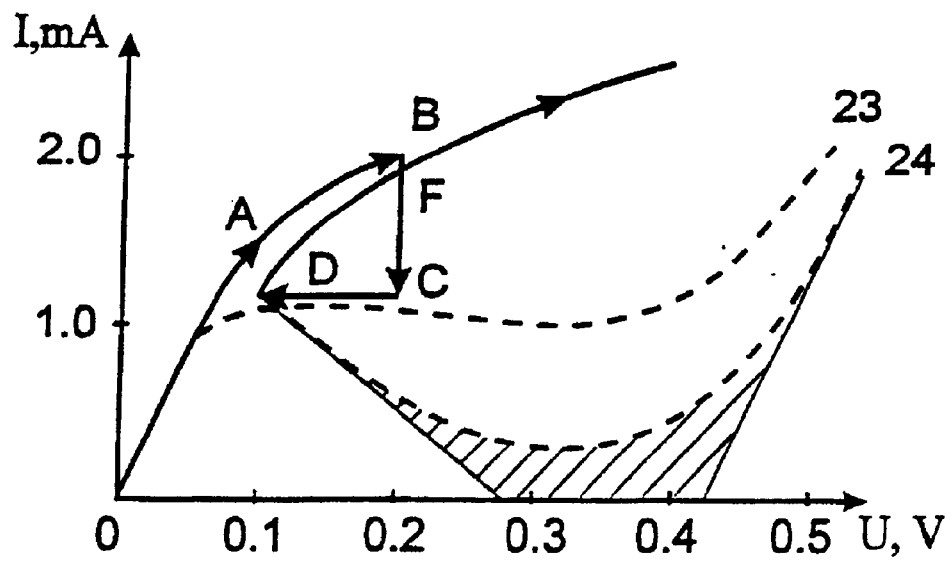
FIG. 12. Experimental current-voltage diagram of a group of logical cells formed in semiconductor.

FIG. 12 shows an experimental volt-amps diagram of a group of logic cells, formed in a semiconductor. Here at the section of 0.0V to 0.1V through this composite material flows the current, determined by a dark current of proper substrate semiconductor—Si. At gaining the voltage 0.1 V (point A) there appear conditions for forming ring electrons in the cluster zone. The effective mass thereof increases causing thereby the decrease of the slope of volt-amps diagram (segment AB). At gaining the voltage of 0.2 V (point B) there appears the condition for electron pairing that result in an abrupt current slope, (line BC). At further voltage decrease to ≈0.11V (line CD) the current stays approximately constant. However if the voltage is increased again, the current will grow but with a smaller slope (line DF). As a result there is formed a closed contour at the volt-amps diagram, in other words—a hysteresis loop. The nature of these loops differs from the hysteresis loop at FIG. 11 by virtue of a high concentration of free carriers at normal temperature in the proper Si substrate.

At a proper control voltage such a cell may function as a current or charge switch for reading the stored photocarriers from the substrate material.

At other concentrations of doping agents the volt-amps diagram may be transformed into a N-shape form, that is characteristic for tunnel diodes (dashed lines 23 and 24, FIG. 12) or fully degenerate into a line.

Comparison with the Drior art analogues.

The validity of the aforementioned analysis and experimental data may be additionally proved by independent known experimental data for commercial tunnel diodes.

Let us assume that for semiconductor tunnel diodes on p-n junction the process of forming ring electrons on clusters of doping agents starts in the point of peak voltage. In this case there is a probability of their condensation into drops or filaments along 2e, 3e, 4e . . . It is known that threshold rated voltages for commercial diodes of various kinds made in Russia are as follows: for germanium diodes—1И104E–$U_n \leq 100$ mV, for gallium-arsenide diodes—3И201A–$U_n \leq 200$ mV. 3И201K–$U_n \leq 330$ mV. Theses data correspond to Un=nU$_e$=99.3 mV; 198.6 nV; 298.0 mV accordingly at n=1,2,3.

The formed drops of ring electron will increase their masses $m_n^* = nm_m/\alpha$, and, hence the current will go down under the geometric progression law at b<1:

$$I \approx a_0 \sum_{k=0}^{n} b^k \qquad (19)$$

The decay of drops starts at gaining the drop size 4e for germanium diodes and 6e for gallium-arsenide diodes. The evaporation of drops occurs due to the constriction of p-n junction to the size less than the length of the electronic filament $<2r_0$. Hence at b>1 the falling branch transfers into the ascending one.

Through statistic spread of clusters along the space (bulk) of the p-n junction the quantum steps of the current at normal temperatures are straighten. They may be described by experimental functions commonly used for tunnel-wave description of such effects. If we assume that a part of electrons has not condensed into drops, then the part of current caused by them will determine the excess current at the trough of the volt-amps diagram (shaded area, FIG. 12) [13].

The validity of the equation (12) supports the fact that the limiting rated generation frequency for any tunnel diodes is not more than $f \leq 40$ GHz (1Л104E). This corresponds to data computed under the formula (12), giving the generation frequency $f_e \leq 350$ GHz. Such operation frequencies may be retained up to $T_e \leq 1150$ K (877° C.), what fully agrees with the maximum possible operation temperatures of gallium-arsenide diodes where the operation temperatures in the pulsed mode may go up to 870 K (597° C.) [20]. Further the material of proper diode degrades under the temperature, but with this the physics of the process itself is not violated. The general current density through p-n junction for such diodes is $j \sim 1$ kA/cm$^2$, what agrees with (14).

The limiting field strength $E_e$ (15) may cause evaporation of electronic drops both in tunnel p-n junctions and in metal-semiconductor junctions. For example for $V_2O_3$ the increase of the field 34 kV/cm leads to the fall of phase transition temperature from 145 K (−128° C.) to 100 K (−173° C.) and further at $E=3E_e=95$ kV/cm to $T_e \approx 0$ K (−273° C.) [16, p.16].

Figure 13:
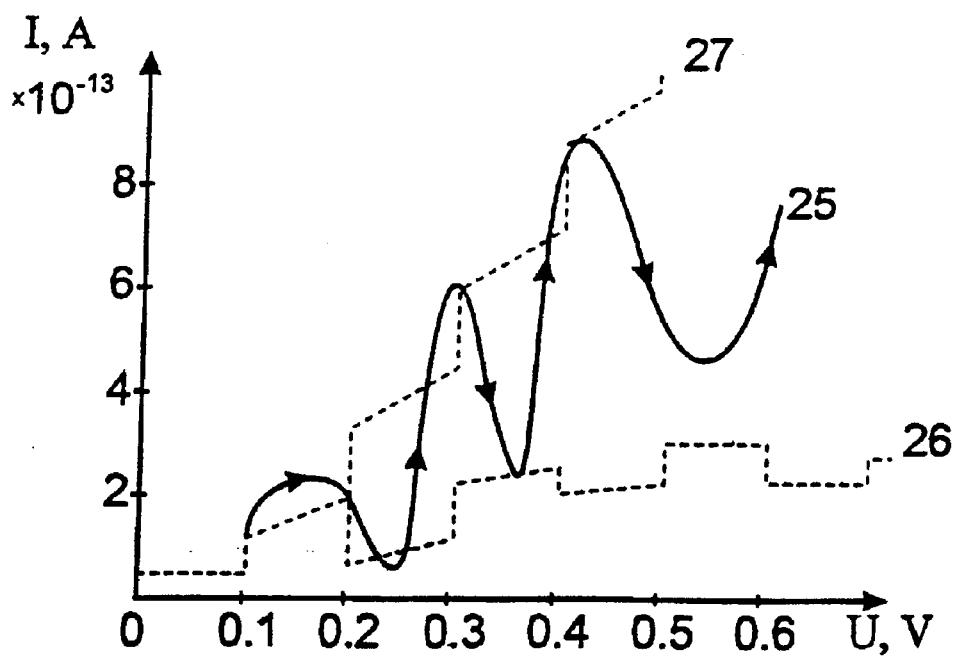
FIG. 13. Current-voltage diagram of a thin-film logic cell on basis of $TiO_x$.

One more experimental proof may serve the work [9]. The author investigated the nano-sized cell, filled with $TiO_x$. As $TiO_x$ has a high-temperature MSPT (500 K–600 K [16]). In the film are created conditions for condensation and decay of electronic pairs. This result in formation of four N-shaped segments on the volt-amps diagrams as shown at FIG. 13, line 25. This figure also shows dependencies computed according to the formula (19) for b<1 (line 26) and b>1 (line 27). As it is seen from the drawing threshold energies of experimental data fully correspond to our analysis. Minor variations are related to the fact that the thickness of titanium electrodes is in all of the order of 2 nm, what is well over $r_0$, i.e., ring electrons are inclined in relation to the motion vector.

A memory cell is an important structure of any logic digital circuit. It may be designed keeping in mind the specialities of interaction of ring electrons (FIG. 2). In order to create a stable logic state we would need minimum two ring electrons, as in this case their overall energy will be minimal. Then using (11–13,16) we find the switching energy $$W_e = 2I_e^2 R_e \tau_e = 2m_e(\alpha^2 c)^2/2\alpha = 3.18 \cdot 10^{-20} J, \qquad (20)$$

that is equivalent to 0.2 eV.

It is possible to show that the condition $W_e \geq 2$ kT/e will be met for the whole range of operating temperatures $T<T_e$, i.e. the signal-to-noise ratio will be above two. Hence the system will be always noise-immune at performing logic operations.

Embodiment of the invention

In 1999 the modern commercial lithographic techniques do not allow designing elements smaller than 180–250 nm. Therefore, at present is required a step-by-step conversion to nano-sized electronic devices created on basis of submicron techniques.

On basis of X-ray electronic or ionic lithography. Under this technology a great many experimental models of nano-sized electronic devices were designed. The devices are described in the patents and papers [4–9]. However, these devices, as a rule, work at helium temperatures and it is improbable that they will be in commercial use in the future.

Active logical films

Making use of the suggested resonance OS-electronic cells in the form of fused single- and multilayer films-composites it is possible to design various digital and analog-digital devices of a micron and submicron size. It is apparent that multilayer active films may be designed of sphere-like clusters:

EXAMPLE 1

Figure 14:
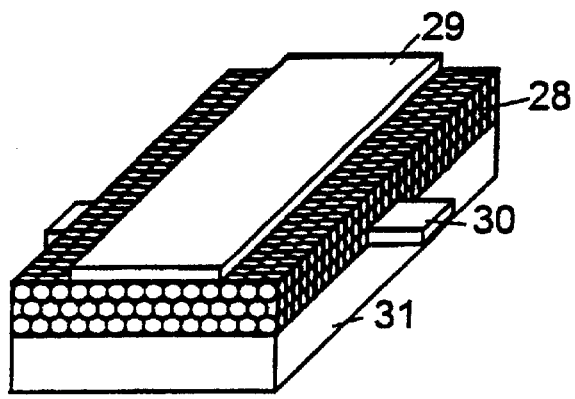
FIG. 14. Design of a multilayer logic cell on basis of spherical clusters.

FIG. 14 shows a structure of a multiyear logic cell based on spherical clusters, where 28 are spherical clusters-cells; 29, 30 are control electrodes; 31 is the substrate. Bulk element, consisting of No clusters 28 that are laid in $N_c$ layers, intervene orthogonal electrodes 29, 30 and are located on the common substrate 31.

Single layer active films may be made of cylinder-like clusters:

EXAMPLE 2

Figure 15:
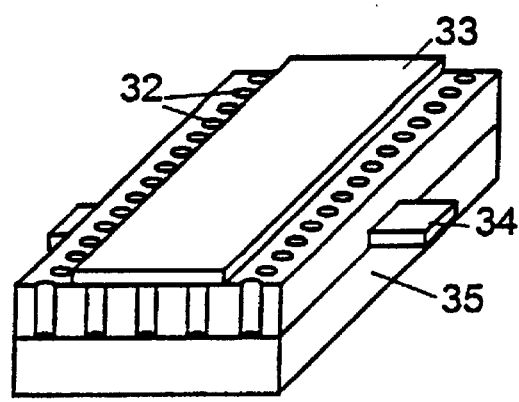
FIG. 15. Design of a logic cell on basis of a group of cylinder clusters.

FIG. 15 shows the structure of logic cell on basis of a group of cylinder clusters, where 32 are cylinder clusters-cells; 33, 34 are control electrodes; 35 are substrate. Cyllinder-like clusters are laid in a single layer between two orthogonal electrodes 33, 34. The whole device is located on a common substrate 35.

In the both examples gaps between clusters may be filled with gas, dielectric or semiconductor.

EXAMPLE 3

Figure 16:
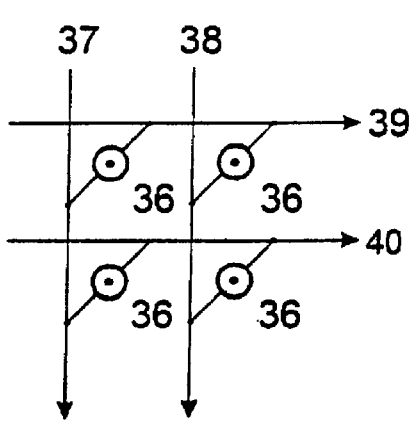
FIG. 16. Volatile memory matrix.

FIG. 16 shows a volatile memory matrix, where 36 are single spherical or cylinder clusters; 37, 38, 39, 40 are orthogonal control electrodes. The record and storage of information in such a cell are based on non-linear hysteresis characteristics (FIG. 11). At disconnection the cell discharges through the voltage distribution bus.

EXAMPLE 4

Figure 17:
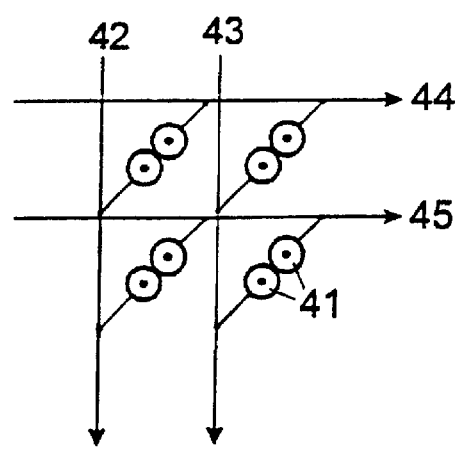
FIG. 17. Non-volatile memory matrix.

FIG. 17 shows a non-volatile memory matrix, where 41 are spherical clusters; 42, 43, 44, 45 are orthogonal control electrodes. This memory cell may comprise serially connected two and more clusters what permits to store information at disconnection. Overcharging of such a cell is performed by back voltage.

For example a submicron memory cell of a size 150× 150×60 nm with an average number of clusters $N_0=50$ and the number of layers $N_c=2$ may be created for such a cell of spherical clusters of a size 30 nm. There may be written from 2 to 100 elementary charges in these cells. In this case the time of storing information in such a cell is unlimited. In the storage mode the cell consumes no energy. Writing pulses $U>2U_eN_e$ or reading pulses $U<2U_eN_e$ may be fed to buses 42, 44. A charge proportional to 0 or 1 of the logic signal may be taken off the control bus in the reading mode.

Active analog photo films.

Beside a digital level a fused multilayer film may store an analog level that is proportional to the total charge of elementary clusters.

EXAMPLE 5

Using films, shown at FIG. 14, the free gaps of which are filled with light-sensitive semiconductor it is easily possible to create matrixes for TV or photo cameras. In this case cluster layer should absorb effectively the photons, i.e. the thickness of the film should be commensurable with light wavelength. This corresponds to 15–17 layers what constitutes of an order 500 nm. Naturally, in this case one electrode 29 should be made of a transparent conductor.

At designing megapickcel light-sensitive matrixes with orthogonal structure (FIG. 17,) a photosensitive cell will occupy an area of an order 100 $\mu m^2$. In order to increase of the spectral photosensitivity the gaps between clusters should be completely filled with the semiconductor material and besides, it is desirable that the enclosures around the cluster nucleus were made of a light-sensitive semiconductor as well. This is connected with the fact that ring electrons as it was mentioned above have a small cross section of interaction with photons and the whole process of photo conversion takes place mainly in the semiconductor.

The work of the light-sensitive matrix is based on the known in the art principles—storing photo carriers during exposition of the image in the semiconductor within a picture. After the end of the exposition of the picture, the pulse signal initiating "breakthrough" of clusters is fed to the buses 29 and 30 (FIG. 14) and the stored photoelectrons are read at the buses in a standard way in analog form similar to digital memory (see. FIG. 17). Then the analog signal is amplified by the bus amplifier and thereafter digitised.

EXAMPLE 6

A light-sensitive matrix may be designed on basis of materials with MSPT. To do this the gaps between cylinder cells (FIG. 15) are filled with light-sensitive semiconductor, and moreover the cell itself is made without tunnel-transparent gaps (FIG. 5). In this case the material with MSPT should work below the point of its phase transition into the metal phase. Photo information is stored similar manner to that described in the Example 5. Reading is performed due to the transition of the channel material into the metal phase under the electrostatic field of the electrodes 33,34 (FIG. 15) according to the formula (15).

EXAMPLE 7

Displays may be easily created with the help of a film shown at FIGS. 14, 15, wherein free spacings are filled with a photoactive material. In this case electrons move in a layer of clusters along narrow extended electrodes and overcome the tunnel-transparent spacings between the clusters that are filled with light-emitting material. The part of electrons is absorbed by luminescence centers, which results in glowing. Thus, it is natural, that one electrode 29 should be made of a transparent conductor. cl EXAMPLE 8

Using the film shown on FIGS. 14, 15, wherein free spacings are filled with a material with a small work function of an electron in empty space, it is easy to create a controllable self-scanning electron source. The electron source of the kind may be used, for example, for making flat displays instead of a cathode gun. In this case electrons move in a layer of clusters along narrow extended electrodes and overcome tunnel-transparent spacings between the clusters that are filled with the material having a small work function of an electron in vacuum. A part of electrons moves inside a film, and the other part moves along a surface of a film. When, for example, the electrode 29 is made electron-transparent in the form of a grid, there appears an opportunity for an electron to go out in to vacuum or in to gas at superimposition of an additional large external electric field.

Active analog distributed memory

Each single cluster having a hysteresis characteristic may store up to 2 electrons. Therefore, by joining them in groups it is possible to make a discrete analog memory with an accuracy of storing analog information rising in proportion to the size of the cluster group.

EXAMPLE 7

If for the base of the analog memory we take a film of the kind shown at FIG. 14, and supply to the buses 29, 30 a voltage difference within the time of analog signal retrieval, then a part of clusters will <<breakdown>> and electrify. The quantity of the charge will determine the level of the <<memorised>> signal. The information may be read by reducing voltage at the cell $<U_eN_c$. Then a standard analog-digital converter may digitise the charge. The number of charged clusters is counted by differentiating the output signal and feeding it to the impulse counter. In the last case due to the large number of elementary clusters each cell has a kind of its own serial analog-digital converter with a capacity determined by $\log_2 N_o$.

EXAMPLE 8

If a layer of clusters is placed between electrodes functioning as a distributed super high frequency resonator, then due to presence of the section of dropping characteristic at the volt-amps diagram (FIG. 11, line CD or FIG. 12, line BC or FIG. 10, line BO), it is possible to create a distributed super high frequency generator with the frequency determined by the resonator characteristics. The maximum boundary frequency of such a generator is determined by the formula (12). An important characteristic of such a generator is a low noise level.

Three-dimensional logic

It is significant that spherical and sphere-like clusters allow three-dimensional connection with direct contact between cells. Such a contact functions as a control or a supply electrode. As a result such a structure allows to change the modern planar approach for the three-dimensional approach increasing thereby the circuit density and hence the operating speed and performance of integrated circuits. Three-dimensional logic is a future-technology in designing parallel matrix computing structures optimised for specific application as well as structures with a large branching level, e.g., in designing neurocomputers.

A large number of clusters connected in series will afford to compensate defective elements by a simple a statistic averaging, increasing thereby in general the yield ratio. Moreover, upon radiation of a layer tracks of the most dangerous heavy alpha particles will be localised by the bulk of clusters situated long the particle track. Hence, radiation tolerance as well as temperature tolerance will sharply rise in comparison with classical semiconductor devices.

Spaced group logical elements.

An important positive characteristic of cluster films is a possibility to design in principle a homogeneous active computing medium allowing both two- and three-dimensional connection architecture. As it follows of the formula (3), the main problem in transmitting signals between nanoelements is presence of parasitic capacitances of connecting elements and output contacts of logical circuits. The problem may be solved by giving the amplifying functions to connecting elements, i.e., a signal should be additionally amplified in the process of passing along buses. The problem of adapting nanologic dimension to the dimensions of the IC contacts requires designing buffer power amplifiers having the operating speed close to the speed of a single cluster, i.e. it is necessary to create a certain scale transformer.

Some variants of designing distributed active logical devices are considered further.

EXAMPLE 9

Figure 18:
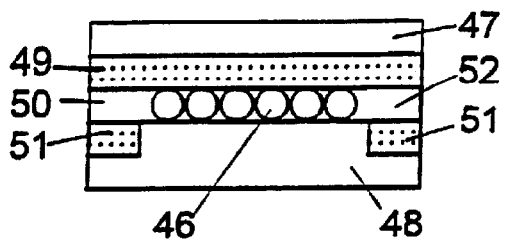
FIG. 18. A variant of connecting control resistive electrodes to a group of contacting clusters.

FIG. 18 shows a variant of connecting control resistive electrodes to a group of contacting clusters, where 46 is a spherical or cylinder cluster, 47, 48 are supply electrodes, 49 is a spaced resistive layer, 50 is a control electrode; 51 is an isolating layer, 52 is the output electrode. Clusters 46 are located on metal substrate 48 and connected to the control electrode 47 through semiconductor medium 49. This medium is a spaced load. Such a load is used in neuristor lines on S-diodes [15], or in spaced runnel junctions or Josephson spaced junctions [14]. It is important that the specific dielectric permeability of the semiconductor was $\in \gg 1$, and the specific resistivity thereof could form the restive load, which crosses the dropping section of the volt-amps diagram of the cluster (FIG. 11, line 22). In this case a wave of switches having a form of a front edge or a soliton may spread in the cluster medium upon pulse supply to electrodes 48, 47. Here the process of signal amplification is conditioned by a negative differential resistance (FIG. 11, section CD of the volt-amps diagram). Initiation of the process may be controlled by the electrode 50, and the signal pick-up—by the electrode 52.

EXAMPLE 10

Figure 19:
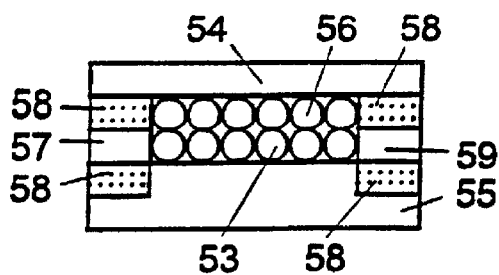
FIG. 19. A variant of connecting control electrodes to a group of contacting clusters through the additional cluster layer.

FIG. 19. Shows a variant of connecting control electrodes to the group of contacting clusters through an additional cluster layer, wherein 53 are spherical clusters; 54, 55 are supply electrodes; 56 is the spaced additional cluster layer; 57 is the control electrode; 58 is the isolated layer; 59 is the output electrode. Due to use of the additional cluster layer both is possible here: the process of transmission of a maintained wave, i.e. soliton, and also storage at one time of the element state at de-energising. Upon activation the process will go on from the pre-power-down state. The whole system resets at change of the supply polarity.

EXAMPLE 11

Figure 20:
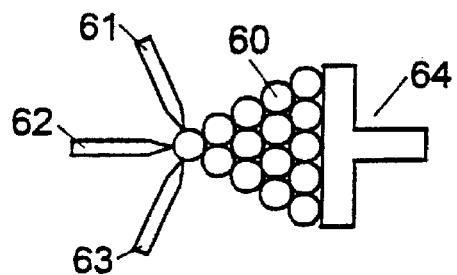
FIG. 20. Group logic cell "OR".

FIG. 20 shows a group logic cell "OR", wherein 60 are spherical or cylinder clusters; 61, 62, 63 are input control electrodes; 64 is the output electrode. A start-up signal initiating the charge wave through clusters 60 comes through any of input electrodes 61, 62, and 63. Electrodes 64 collect the amplified charge in clusters. All clusters are supplied by electrodes as shown at FIG. 18 (electrodes 47, 48). Electrodes 61, 62, 63 correspond to the electrode 50 and electrode 64 correspond to the electrode 52.

EXAMPLE 12

Figure 21:
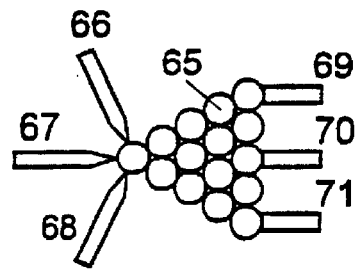
FIG. 21. Group logic cell "OR" with branching at the output.

FIG. 21 shows a group logic cell "OR" with output branching, wherein 65 are spherical or cylinder clusters; 66, 67, 68 are input control electrodes; 69, 70, 71 are output electrodes. Here in the similar manner as in the example 11 the initial start-up of the charge wave is performed by any of the electrodes 66, 67, 68. However the outputs are independent, branching the input signal to three outputs. Clusters 65 are supplied in the same way as in example 11.

EXAMPLE 13

Figure 22:
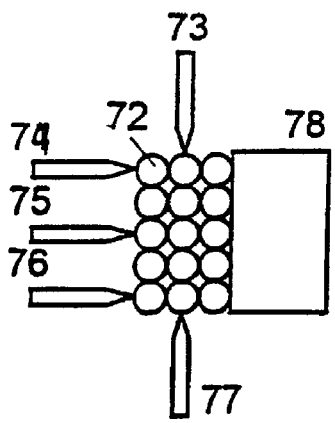
FIG. 22. Group logic cell "OR" with a highower output.

FIG. 22 shows a group logic cell "OR" with a power output, wherein 72 are spherical or cylinder clusters; 73, 74, 75, 76, 77 are input control electrodes; 78 is the output electrode. Here the input signal is supplied to any cluster group by means of any to one of electrodes 73–77. The charge wave is amplified by a group of clusters and collected by the output electrode 78. This electrode may function as an input of a standard logical element based on field or bipolar transistors of micron size or may directly be an output contact of a logic nanoelectronic microcircuit.

Directionality of a signal

As it is shown on FIGS. 1, 3, cluster is an electrically symmetric element. Some applications yet require a signal with one directional propagation. In order to perform this function it is necessary to assign a correct direction of the electric field strength gradient. To do this it is required to form geometrically in the proper direction the electrode tapers connecting clusters or produce electrodes of materials with various output works.

EXAMPLE 14

Figure 23:
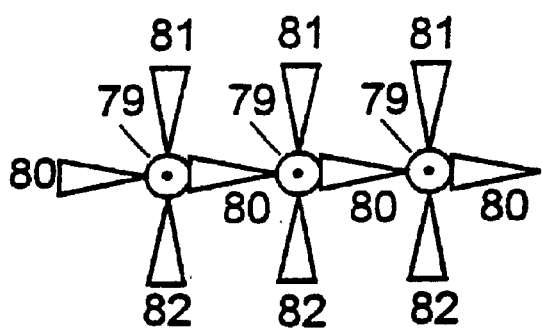
FIG. 23. A variant of integrating logic cells with a predetermined signal direction.

FIG. 23 shows a variant of integrating logical cells with targeted signal direction, wherein 79 are spherical or cylinder clusters; 80 are information electrodes; 81, 82 are supply electrodes. Here the input signal propagates from left to right along the electrodes 80 through clusters 79. Both the continuous and the pulse supply are connected directly to electrodes 81, 82.

EXAMPLE 15

Figure 24:
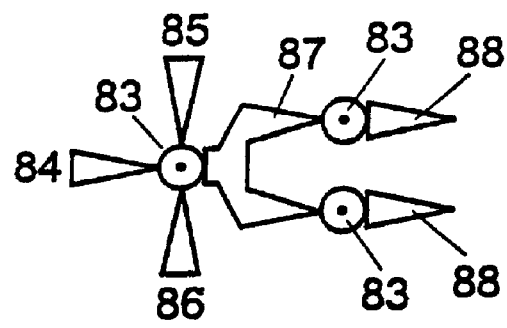
FIG. 24. A variant of integrating logical cells with a predetermined direction of signal passing and branching.

FIG. 24 shows a variant of integrating logical cells with targeted direction of signal passing and branching, wherein 83 are spherical or cylinder clusters; 84 are information electrodes; 85, 86 are supply electrodes, 87 is the branched information electrode. Here the input signal is fed through the electrode 84, amplified in the cluster 83, and further branched into two or more outputs by the electrode 87 and fed to the similar device through electrodes 88.

Local logical elements

Local logical elements may be created by using a method of targeted propagation of a signal.

EXAMPLE 16

Figure 25:
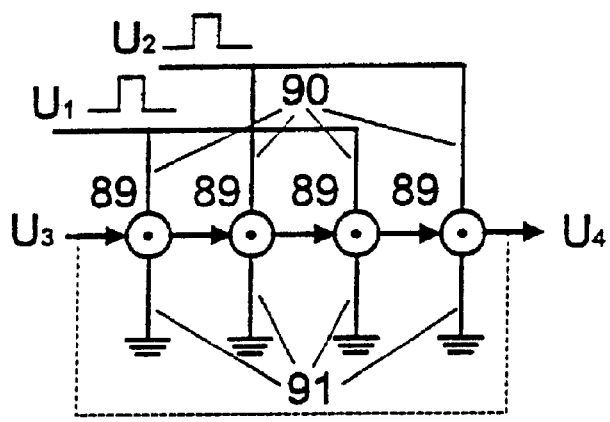
FIG. 25. Shift register.

Using targeted electrodes it is only suffice to make a unidirectional shift register. FIG. 25 presents such a shift register, wherein 89 are spherical or cylinder clusters; arrows indicate information electrodes; 90, 91 are supply electrodes; $U_1$, $U_2$ are antiphase pulse supply voltages; $U_3$ is the input voltage; $U_4$ is the output voltage. The out-of-phase pulse supply is fed to buses $U_1$, $U_2$. Logical signal from the input $U_3$ is successively shifted along the circuit at cells 89 to the output $U_4$.

EXAMPLE 17

Figure 26:
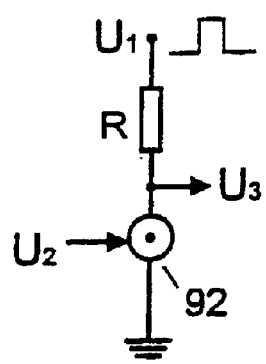
FIG. 26. Volatile logic element "NOT".

FIG. 26 shows volatile logical element "NOT", wherein 92 is the spherical or cylinder cluster, $U_1$, is the pulse or direct supply voltage; $U_2$ is the input voltage; $U_3$ is the output voltage; R is the resistive load. The pulse or direct supply voltage is fed to the supply bus $U_1$, the control electrode $U_2$ functions as the control electrode similar to the gate function of the field transistor, i.e., performs the function of inversion—"NOT".

EXAMPLE 18

Figure 27:
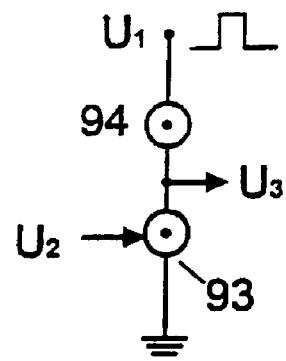
FIG. 27. Non-volatile logic element "NOT".

FIG. 27 shows a non-volatile logical element "NOT", wherein 93 is a spherical cluster; 94 is the additional cluster; $U_1$, is the pulse supply voltage; $U_2$ is the input voltage: $U_3$ is the output voltage. The device here works in the similar way as in the example 17, however the load is the additional cluster 94. Such a circuit serves for information storage at the off mode. The supply of the device unlike in the example 17 may be only the pulse supply. Cluster 94 needs overcharging. At de-energising two paired electrons may remain in one of the two serially connected clusters. In this case the pair of clusters is, in fact, a logical trigger.

EXAMPLE 19

Figure 28:
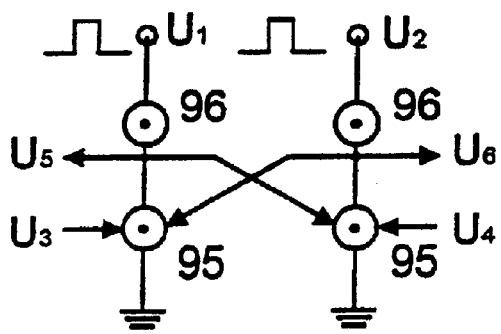
FIG. 28. Non-volatile trigger.

A two level trigger for four states may be made by transverse joining of two logical elements "NOT" with memory (FIG. 27) and etc. Logical elements having the base >2 may be produced by connecting a large number of clusters in various configurations. FIG. 28 shows a non-volatile trigger, wherein 95 are spherical clusters; 96 are additional clusters; $U_1, U_2$ are pulse supply voltages; $U_3, U_4$ are input voltages; $U_5, U_6$ are output voltages. The said trigger operates under the standard circuit using transverse joint of logical elements "OR" and "NO".

EXAMPLE 20

Figure 29:
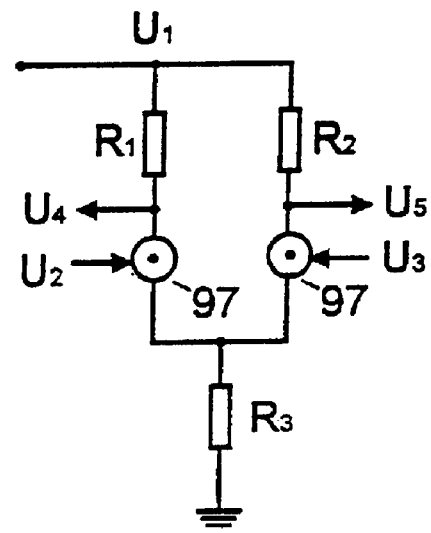
FIG. 29. Analog signal comparator.

Joining of two devices depicted at FIG. 26 makes it possible to design a differential amplifier of analog signals on the basis of which various known analog devices may be produced. For example FIG. 29 shows a comparator of analog signals, wherein 97 is the spherical cluster or cylinder cluster; $U_1$ is the supply voltage; $U_2$ is the input voltage; $U_3$ is the reference voltage; $U_4, U_5$ is the output voltage; $R_1, R_2$ are resistive loads; $R_3$ is the common resistor.

As the aforementioned examples cover the most typical variants of connecting elements used both in analog and in digital devices for processing information, on the basis thereof those skilled in the art may easily combine any required IC elements. This is made by a mere combination of a resistive or cluster load. The more so as clusters themselves, depending upon requirements, may be made on basis of OS-, PS- or APS-electronic effects. Supply electrodes may be made of metals, superconductors or materials with metal-semiconductor phase transition.

EXAMPLE 21

Figure 30:
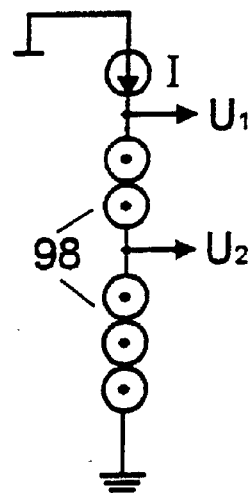
FIG. 30. Standard voltage source.

As it follows of (16), the quantum resistance of a cell will exceed the Josephson resistance equal to h/2e, by 1/α. Thus, there may be designed a sample low noise resistance at normal temperature with an accuracy determined by common constants h, e, α, c, i.e. with an error of an order $10^{-7}$. It may be connected to the current source, e.g. as shown at FIG. 30 forming thereby a standard voltage source. FIG. 30 shows: 98 is the spherical cluster; I is the current source; $U_1, U_2$ are standard output voltages.

Neurone logics.

Neurocumputers are the most advanced approach to the future development of parallel computing structures. The base element thereof should perform functions of threshold comparison and summing of several inputs with different weight [40].

EXAMPLE 24

Figure 31:
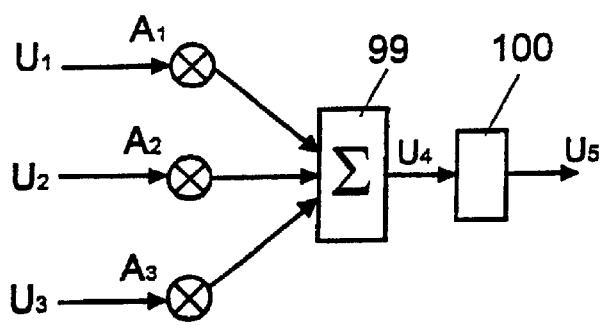
FIG. 31. Neurone logic element.

FIG. 31 shows a neurone logical element, wherein $U_1, U_2, U_3$ are input voltages; $A_1, A_2, A_3$ are weight multipliers; 99 are analog summators; 100 is the threshold element; $U_4$ is the summator output voltage; $U_5$ is the output voltage.

Figure 32:
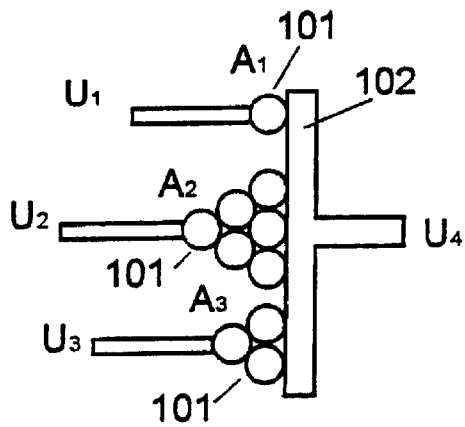
FIG. 32. Non-volatile weight summator of a neurone logic element.

Active films connected as shown on FIG. 20 and having only one input are useful for weight summing operations. A group of such elements joined together by a common electrode forms a non-volatile weight summator of a neurone logical element, as shown at FIG. 32, wherein 101 are weight groups of spherical clusters with weights $A_1, A_2, A_3$; $U_1, U_2, U_3$ are input voltages; $U_4$ is the summator output voltage.

Due to discreteness of charge carriers the operation of weight multiplying is accomplished in a discreet manner. In this case the input signal $U_1, U_2, U_3$ will multiply in clusters-cells in proportion to the number of these cells. $U_1$ will correspond to the weight $A_1=1$, $U_2$—to the weight $A_2=3$ and $U_3$ to the weight $A_3=2$. Summing of the signal is accomplished at the electrode 102.

Figure 33:
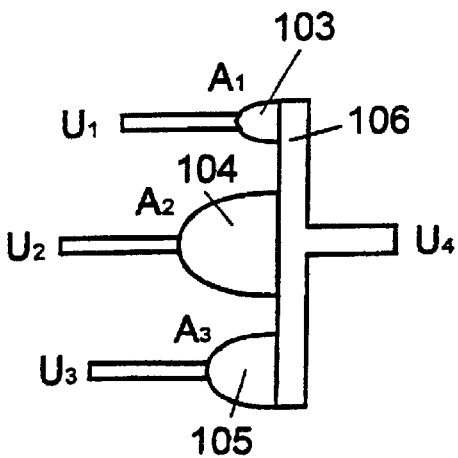
FIG. 33. Volatile weight summator of a neuron logic element on basis of materials with metal-semiconductor phase transition.

The function of weight summing may be also accomplished by films having MSPT. FIG. 33 shows volatile weight surunator of a neurone logical element on basis of materials with MSPT, wherein 103, 104, 105 are weight groups of clusters with weights $A_1, A_2, A_3$; $U_1, U_2, U_3$ are input voltages; $U_4$ is the summator output voltage; 106 is the output electrode. In this case the film area will determine the ratio of signal multiplication at the charge. The charge level will determine the weight according to $A_1, A_2, A_3$, in the similar way to the aforementioned case.

For devices shown at FIGS. 32, 33 the output signal $U_4$ is supplied to the comparison element made, e.g. according to the circuit (FIG. 29), wherein the threshold comparison is accomplished.

If the weight summator is made under FIG. 32, and the supply is fed through additional cluster layer under FIG. 19, then it is possible to perform weight summing with memory. This function with memory is the closest description of the real neurone.

Galvanic cross coupling

On frequent occasions, combined operation of analog and analog-digital parts of an integrated circuit requires elimination of cross-voltaic effect along control and supply buses. For this may be used the cross effect of ring electrons in two electrodes located at the distance less than $r_0$. When electrodes are present at such a distance there occurs current induction without any galvanic coupling. In this case alternating voltage need not be used, as the circuital field is the ring electron itself.

EXAMPLE 25

Figure 34:
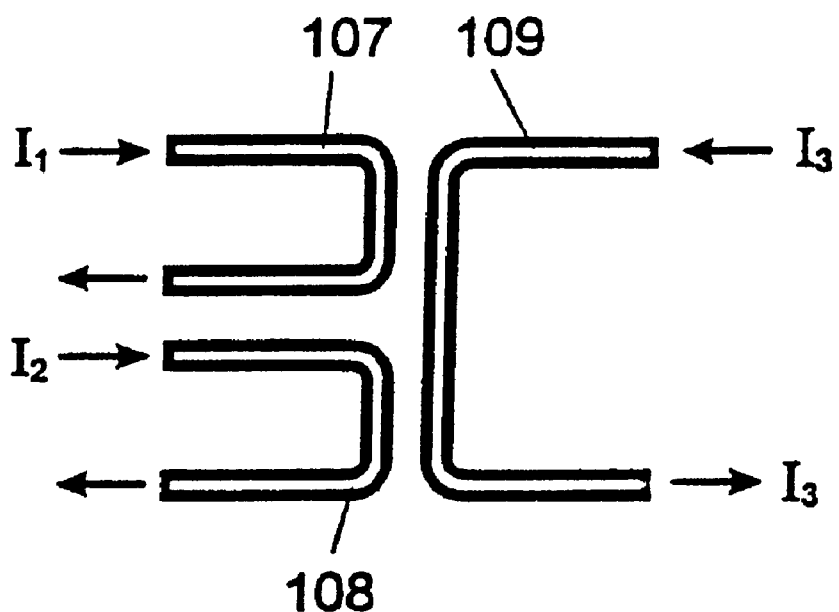
FIG. 34. Current transformer.

FIG. 34 presents current transformer, wherein 107,108 are input electrodes made of superconductor or material with metal-semiconductor phase transition; 109 is an output electrode; $I_1, I_2$ are input currents; $I_3$ is the output current. The input currents $I_1$ or $I_2$ may be both alternating and direct currents. The output current $I_3$ will be related to the input currents through the transformation ratio. A engagement of electronic rings is possible due to interaction of their fields, when the cross size of a conductor does not exceed the diameter of a ring electron or is a little bit less than the latter, and another conductor, with conditions sufficient for forming ring electrons, is adjacent to the said region. In this case a constant or alternating current may be induction supplied.

EXAMPLE 26

Figure 35:
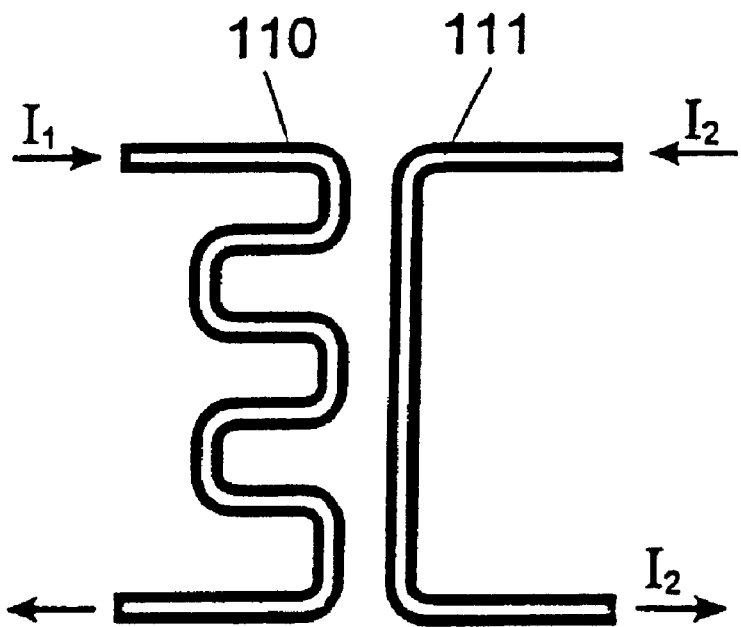
FIG. 35. Converter.

FIG. 35 presents a dc-to-ac transducer, wherein 110 is an input electrode made of superconductor or material with metal-semiconductor phase transition; 111 is the output electrode; $I_1$, is the direct input current; $I_2$ is the alternating output current. When one of the transformer electrodes is made in the square waveform having near regions to the output electrode up to the distance of $<2r_0$, and remote regions from the output electrode up to the distance of $>2r_0$, then in the output electrode 111 there will be induced the currents that appear only at the near regions. If in this case the conditions of current flow in the remote regions differ from the conditions at the near regions, then the electrons may move through the output electrode in groups. Due to this fact an alternating current is induced in the output circuit, i.e., the said device allows transforming direct current into alternating current or transforming one form of the alternating current into another form. The inhomogeneity of condition for a current flow may be created at the expense of geometrical changes. Thus, when the output electrode has a variable cross-section, exceeding $2r_0$ or being less than $r_0$, the flowing current will concentrate in groups. If the electrode 111 is made of superconductor or of a material with MSPT, and the alternating current is connected to the electrode, then the current of another form will flow through the electrode 110. Under certain conditions and lag, a direct current may be induced at the output. With this, the function of rectification of alternating current is accomplished only at frequencies proportional to the time of carrier movement along the approach region. At the same time the devices of the kind function as a galvanic cross coupling provided the voltage between the electrodes is not above 0.1 V.

Technological Implementation

The claimed invention opens a prospect to increasing operation temperatures and, hence, to commercial realizability of devices. However, the problem is whether it is possible to use the modern techniques for producing the proposed devices and whether the mass-produced devices are economical.

The engineering feasibility of the invention will be disclosed further.

The possibility of producing the claimed logical cell on the modern technological base is demonstrated below.

There are three methods of forming spherical and sphere-like particles [1]. The first method—metal or semiconductor clusters of a diameter up to 37 nm are formed of a gas phase with their further oxidation in the oxygen flow or similar chemicals. Formation of such particle is similar to formation of hail in the Earth atmosphere. The second method is the colloidal method. It is based on cluster precipitation from metal salt solutions following by the chemical coating with corresponding enclosures. The third method is based on collective effects in solid supersaturated solutions similar to pyroceram.

Hollow clusters may be made of xerogels [41] or by gas blowing of the liquid drops at adding of volatile components-additives with further cooling in upward gas current [42]. Nanosized hollow spheres of zirconium dioxide are automatically obtained during the process of high-frequency plasrna-chemical denitrification; therefore they may be applied to the substrate directly from plasma. [43].

Designing planar vertical nanochannels is based on collective formation methods, e.g. according to electrochemical oxidation Al, Ta, Nb, Hf, etc. The formed channel may be filled with metal or semiconductor by the galvanic technique [44].

The aforementioned examples show that the modern techniques allow producing nanometer logical cell and integrated circuits on the basis thereof. For example clusters may be quickly produced in colloidal solutions and precipitated on substrates by spinning within 60 sec. Clusters may be also produced by evaporation of a metal by means of a plasmatrone at a speed of the order 1 $cm^3$/min followed by condensation in a gas flow and precipitation on a substrate. This results in producing clusters having d~35 nm. Both colloidal and vapour-phase techniques allow to obtain from 1 $cm^3$ material about $2.3 \cdot 10^{16}$ clusters that are full-value quantum devices, i.e. transistors. It should be noted that digital microcircuit personal computing machines manufactured in the world during a year is comprise approximately the aforementioned number of transistors.

It is important that the cluster layer, which is not located directly under electrodes, forms a passive area that not involved into signal transforming. Due to collective methods of producing, the cost of clusters is so small that it practically makes no effect on the overall cost of a product.

At present there exists no serial (experimental) lithography techniques, which allow producing nanometer components. The said techniques are X-ray, electronic, ionic lithography. Using these technologies it is possible to produce electrodes of desired dimensions, as well as openings in nanosize films. Moreover, there are reliable technologies for producing of every possible semiconductor dielectric nano-size films. The two technologies allow to apply electrodes of desired configurations on to films made of clusters and, hence, to create quantum-size devices already disclosed in the said patent appication. In prospect it is necessary to arrange these technologies for serial production.

Thus, nanotechnology just now provides possibilities for leaving the frameworks of silicon and gallium-arsenic techniques and starting to review the conceptions of designing solid-state electronic high-temperature microcircuits and to produce devices operable up to 600 K (327° C.).

The development of technologies for collective growing of nanometer clusters from low-cost high-temperature superconductive materials will allow to design essentially new power transmission lines, superconducting energy stores, generators of electrical energy, electric motors with high efficiency factor, etc., working at the temperatures up to 93.5° C.

At present there exists a great number of techniques for growing from every possible materials of sufficiently gaunt (up to 100 nm) films of nanometer thickness (10–100 nm), the so-called "whiskers" [45]. Essentially, the films are free of defects monocrystals that have high strength properties. For high-temperature cables electrical characteristics are more important than the mechanical attributes. Therefore, the "whiskers" can be arranged, by coating them with a binding substance, in long conductors by arranging an electrical contact between them. In this case the ring electron can move from one "<<whisker" to another "<<whisker", if the impurity centers will be located on the distances not exceeding $r_0$.

Making fibers based on high-molecular compounds is an alternative version for creating high-temperature superconductivity. For example, a high-molecular compound may be an oxidative elastomer, in which superconducting channels may be formed in a natural fashion under a particular technology [46]. The other example of making high-temperature superconductors on high-molecular compounds may be an oxidative polypropylene [34]. In this case oxygen functions as a conductive additive. The technology of producing fibers on basis of propylene and elastomeres is well developed in the industry for micron-diameter fibers. When the fibers are processed in an appropriate way under the above-mentioned criteria, it is possible to produce high-temperature superconductors with a low critical current density. Now it is only necessary to move to the following technological step by leaning to create nanometer fibers with a limiting current density.

One technique for producing high-temperature superconductors on high-molecular compounds consists in making micro tubes on basis of the tubuline protein and a number of other proteins. Generally, the micro tubes participate in the process of motion of life cells and in transmission of nervous impulses. As a rule, they are hollow long cylinders of several micrometers length with the exterior diameter of: ~24 HM and the interior diameter of 15 nm. The micro tubes may be produced in large amount s under the microbiological technology or directly by synthesis in special reactors with use of catalytic agents—enzymes. It is important, that length of the micro tubes is basically unlimited by anything. In the process of an appropriate doping the micro tubes may transform into high-temperature superconductors. them in bundles it is possible to receive Cheap, flexible cables may be produced by arranging the microtubes into assembles.

It will be apparent to those skilled in the art that the examples and combinations of electronic devices together with the operation conditions thereof as disclosed in the specification and claims do not limit the scope of the invention. Similar devices and components may also be practised within the framework of this invention.

INFORMATION SOURCES

1. Petrov U. I. Cluster and minor particles. M. Nauka 1986, 368 pp.
2. Likharev K. K. On possibilities of designing analog and digital integrated circuits on basis of the effect of discrete single electronic tunnelling. Microelectronics. Vol. 16, ed.3. 1987, p.195–209.
3. Rose A. Vision Human and Electronic. M. Mir. 1977
4. U.S. Pat. No. 5,731,598
5. U.S. Pat. No. 5,420,746
6. U.S. Pat. No. 5,677,637
7. U.S. Pat. Nos. 5,075,736; 5,166,615; 5,258,625; 5,323,344; 5,357,548; 5,401,980; 5,422,496; 5,426,311; 5,504,366; 5,540,977; 5,559,328; 5,559,343; 5,581,091; 5,619,035; 5,629,231; 5,646,559; 5,694,059; 5,677,637; 5,714,766; 5,731,717; 5,742,071; 5,754,077; 5,877,511; 5,937,295; 5,963,471.
8. U.S. Pat. No. 5,389,567
9. Matsumoto K, Sepawa K., Oka Y., Vartanian B. J., Haris J. S. Room temperature operation of a single electron transistor made by the scanning tunnelling microscope nanooxidation process for the $TiO_x$/Ti system. Appl. Phys. Lett 1996. V.68.N1.P.
10. High voltage technique: Theoretical and practical principles of use. M. Beier et al. M. Energatomizdat 1989.
11. PCT WO 98/21754 of 22.05.1998
12. Buzaneva E. V. Microstructures of integral electronics. M. Radio. 1990.
13. Tunnel effects in solid bodies. Edited by E. Burstein, S. Lundquist. Translation from English. M. Mir. 1973.
14. Likharev K. K. Introduction to dynamics of josephson junction. M. Hauka 1985. 320 pp.
15. Stafeev V. M., et al. Neuristor and other functional circuits with three-dimensional coupling. M. Radio and communication. 1981. 111pp.
16. Metal-semiconductor-phase transition and use thereof. Bugaev A. A. et. al. Nauka 1979. 183 pp.
17. Demishev S. V., et al. ThermoEMF quasi two-dimensional organic conductors of the assemblage (BEDT-TTT)$_m$X$_n$. Journal of Theoretical and Experimental Physics. 1998. V113.Ed.1.p.323–338.
18. WO 97/36333.
19. U.S. Pat. No. 5,530,263
20. Fistul V. I. Heavy doped semiconductors. M. Nauka. 1967.
21. Ilyanok A. M., Quantum astronomy. Part II, News of the Institute of Modern Knowledge.1999. No. 2–3. Published also at http:/xxx.lanl.gov. A. M. Ilyanok Quantum Astronomy. Part Ii.
22. L. De Broglie, D. Bohn, P. Hillion, F. Halbwachs, T. Takabayasi G. P. Vigier. Rotator Model of Elementary Particles Considered as Relativistic Extended Structures in Mincowski. Phys.Rev. 1963. V.129.No 1. p.438–440.
23. Buneman O. Proc. Cambr. Phil. Soc. 1954. V.50.p.77.
24. Motora I. M. Preprint P4-81-81. Assoiate Institute of Nuclear Researches, Dubna. 1981
25. Rabsha E. I., Timofev V. B. Hall quantum effects. (Review). Physics and techniques of semiconductors. 1986. V.20. No6, p.977.
26. Deriagin B. V et al. Surface forces. M. Nauka 1985.
27. Quantum and exchange forces in condensed mediums. Kulakov A. V. et al. M. Nauka. 1990. 120pp.
28. Druszkin L. A. Objectives of the field theory. M. Energia 1964
29. Maple M. B. New types of superconductivity in f-electronic systems. Physics abroad. Articles. Series A. M. Mir, 1987.pp.
30. Electronic-hole drops in semiconductors. Keldysh et al., Edited by Jefrice K. D. et al., M., Nuaka, 1988. 477 pp.
31. Tennakone K., Lokunetti C. S. et.al. The Possibility of an Above-Room-Temperature Superconducting Phase in xCuBr. CuBr2. J.Phys.C Solid State Phys. 21. 1988. P.L643–L647.
32. Riley J. F., Sampath W. S., at al. Meissner Effect up to 300 K in Microscopic Regions of Y—Ba—Cu—O. Phys. Rev. B. 1988. V.37.N1.p. 559–561/
33. Superconductivity Researchers Tease Out Facts From Artifacts. Science. 1994. V.265. p.2014–2015.
34. Enicolopian N. S. et al., Possible superconductivity of oxidised polypropylene in the area 300 K. Letters to Journal of Theoretical and Experimental Physics. 1989. V.49. Ed. 6. p. 326–330.
35. Masterov V. F. et al., High-temperature superconductivity in the system carbon-cuprum. Letters to Journal of Theoretical and Experimental Physics. 1994. Vol.20. Ed.15. p.17–21.
36. Obolensky M. A. et al., Anizothropy of critical current at vortexes pinning at twins in $YBa_2Cu_3O_{7-x}$ monocrystalls. Superconductivity: Physics, Chemistry, and Techniques. 1994. Vol.7.No1.p.43–47.
37. Superconducting materials. M. Metallurgy. 1976.
38. Rezaitskich O. G. et al., Study of normal state of electronic Y-123 spectrum by methods of microcontact and tunnel spectroscopy. Superconductivity: Physics, Chemistry, Techniques, 1994. Vol.7. No2.C. 322–326.
39. Hayakawa H. Technology of josephson computers. Physics abroad. Articles Series A., M. Mir. 1987.272 pp.
40. Neurocomputers and intellectual robots/Amosov N. M., et al., Naukova dumka, Kiew 1991.
41. JP 07021716 of 09.02.1995. Publication No. 08218163 of 27.08.1996.
42. Budov V. V. Physical-chemical processes in the technology of hollow glass microspheres. Glass and Ceramics. 1990. No3, p.9–10.
43. Dedov N. V. et al., Structural studies of powders on basis of zirconium dioxide produced by HF-plasmachemical denitration method. Glass and Ceramics. 1991. No10, p.17–19.

44. Averianov E. E. Anodization manual, M., Mashinostroenie, 1988
45. U.S. Pat. No. 5,897,945
46. Grigorov L. N. On the physical nature of super-high conductive channels of polar elastomeres, Leiters to the Journal of Theoretical Physics, 1991, V.17, Ed. 10.
47. Physical Encyclopedia, V. 2, Prokhorov M., Big Russian Encyclopedia. 1998, p. 379.

What is claimed is:

1. A quantum-size electronic device comprising electrodes, at least one cluster and a tunnel-transparent gap, characterised in that the cluster has at least one distinguished size found from the formula $$D = a\, r_0,$$

wherein $r_0$ is the circular radius of an electron wave under the formula $$r_0 = \hbar/(m_e \alpha^2 c),$$

wherein $\hbar$ is the Planck's constant; $m_e$ is the electron mass; $\alpha = 1/137036$ is the fine structure constant; c is the light speed; a is a coefficient determined in the range of $1 \leq a \leq 4$, the thickness of the tunnel-transparent gap not exceeding $r_0$, the spacing between the electrodes exceeding $r_0$.

2. The device according to claim 1, characterised in that the said cluster is made of conductor.

3. The device according to claim 1, characterised in that the cluster is made of semiconductor.

4. The device according to claim 1, characterised in that the cluster is made of superconductor.

5. The device according to claim 1, characterised in that the cluster is made of a high molecular organic substance.

6. The device according to claim 1, characterised in that the cluster is made in the form of a cavity having a sheath of a tunnel-transparent gap.

7. The device according to claim 1, characterised in that the cluster has a centrally symmetric form.

8. The device according to claim 1, characterised in that cluster has an axisymmetric form.

9. The device according to claim 8, characterised in that the cluster is made extended and has a distinguished cross-sectional size determined by the formula $$d = b\, r_0,\ 2 \leq b \leq 4.$$

10. The device according to claim 9, characterised in that the cluster is made extended along the axis and has a regular structure with a period determined by the formula $$\tau = b\, r_0,\ 1 \leq b \leq 4.$$

11. The device according to claim 1, characterised in that a plurality of clusters is regular located at least in one layer, and the spacings between clusters are tunnel-transparent not exceeding $r_0$.

12. The device according to claim 1, characterised in that the clusters are connected to at least two electrodes, one of which is a control electrode.

13. The device according to claim 1, characterised in that the clusters are connected to at least three electrodes, at least one of which is a control electrode.

14. The device according to claim 1, characterised in that the electrodes are made of conductor or/and semiconductor, or/and superconductor or/and conductive organic materials.

15. The device according to claim 1, characterised in that the clusters are integrated into groups, forming thereby one-dimensional or/and two-dimensional or/and three-dimensional structures.

16. The device according to claim 15, characterised in that the clusters are integrated into groups by means of reciprocal location of discrete electrodes.

17. The device according to claim 16, characterised in that the clusters are integrated into groups by means of reciprocal location of discrete electrodes and the form thereof.

18. The device according to claim 1, characterised in that the clusters are integrated into insulated spacial groups that are connected to corresponding electrodes.

19. The device according to claim 1, characterised in that the electrodes are made of conductor and have a resistivity $$\rho \leq 10^{-3}\ \Omega\text{cm}.$$

20. The device according to claim 1, characterised in that the electrodes are made of conductor and have a cross-sectional dimension $d \geq r_0$.

21. The device according to claim 1, characterised in that the electrodes are made of superconductor and have a cross-sectional dimension $d \geq 2\, r_0$.

22. The device according to claim 1, characterised in that the electrodes are made of material having a metal-semiconductor phase transition, and have a cross-sectional dimension $d \geq 2\, r_0$.

23. The device according to claim 1, characterised in that the cluster is connected to at least two control electrodes, a set of such clusters forming a storage cell matrix.

24. The device according to claim 1, characterised in that two or more series clusters are connected to at least two control electrodes, a set of such clusters forming a storage cell matrix.

25. The device according to claim 1, characterised in that two or more clusters are connected to at least two supply electrodes at least through one resistive layer.

26. The device according to claim 25, characterised in that two or more clusters are connected to supply electrodes and integrated in a group in the form of one layer of directly mutually contacting clusters, one or more clusters being connected to control output electrodes, and the other cluster or clusters being connected to output electrodes, forming thereby the output of the logical element "OR".

27. The device according to claim 25, characterised in that two or more clusters are integrated in a group in the form of a one-dimensional series circuit, the even elements of the said circuit are connected through resistive layers to the first supply electrode and the odd elements are connected through resistive layers to the second supply electrode, the said odd elements forming a logical shift register.

28. The device according to claim 1, characterised in that two or more clusters are connected to supply electrodes and integrated in a group in the form of one layer, one or more clusters are connected to control input electrodes, the other cluster or clusters are connected to output electrodes, the input and output clusters are joined together through additional electrodes having the same thickness and width, said electrodes can be connected to one or more clusters of the next group.

29. The device according to claim 1, characterised in that two or more clusters, are connected to supply electrodes and integrated in a group in the form of one layer, one or more clusters are connected to control input electrodes, and the other cluster or clusters are connected to the output electrode, input and output clusters are joined together through additional electrodes tapered at one side in the signal direction, the said electrodes can be connected to one or more clusters of the next group.

30. The device according to claim 1, characterised in that the input voltage is supplied directly through one or more control electrodes connected to clusters through the tunnel-transparent gap, the cluster is connected through a resistive element to the supply voltage, the junction point is connected to the output electrode, forming thereby the output of the logical element "NOT".

31. The device according to claim 1, characterised in that two clusters are connected to the supply voltage through resistive elements, the first input voltage is supplied directly through the first control electrode connected to one cluster through tunnel-transparent gap, the second input voltage is supplied to the second electrode connected to the other cluster through the tunnel-transparent gap, some of junction points of the resistive elements of each cluster are joined together, the other junction points of the resistive elements are connected to output electrodes, forming thereby the outputs of the analogue comparator of two signals.

32. The device according to claim 1, characterised in that two clusters are connected through resistive elements to the supply voltage, the junction points thereof are connected to the output electrodes, the first input voltage is supplied directly through the first control electrode that is connected to the first cluster through the tunnel-transparent gap, the second input voltage is supplied directly through the second control electrode that is connected to the second cluster through the tunnel-transparent gap, the first output electrode is connected to the second cluster through the tunnel-transparent gap, the second output electrode is connected to the first cluster through the tunnel-transparent gap forming thereby a bistable trigger.

33. The device according to claim 1, characterised in that one and more clusters are connected through the resistive layer to the supply voltage and form isolated groups combined by one common output electrode, each isolated group of clusters is connected to one or more control input electrodes, the number of clusters in each group determines the weight function according to the input signal and forms a neurone-type logical component—a weight summator.

34. The device according to claim 1, characterised in that one or more clusters are connected to the supply electrodes at least through one additional cluster layer.

35. The device according to claim 34, characterized in that two or more clusters are connected to the supply electrodes and joined together in a group in the form of a single layer of directly together contacting clusters, one or more clusters are connected to control input electrodes, the other cluster or cluster are connected to output electrodes, forming thereby the output of the logical element "OR" with memory.

36. The device according to claim 34, characterised in that two or more clusters are connected to supply electrodes and integrated in a group of in the form of a single layer, one or more clusters are connected to the control input electrodes, the other cluster or clusters are connected to the output electrodes, the input and output clusters are joined together through additional electrodes of same thickness and width, the said electrodes can be connected to one or more clusters of the next group.

37. The device according to claim 34, characterised in that two or more clusters are connected to supply electrodes and integrated in a group in the form of a single layer, one or more clusters are connected to control input electrodes, the other cluster or clusters are connected to output electrodes, the input and output clusters are joined together through additional electrodes tapered at one side in the signal direction, the said electrodes can be connected to one or more clusters of the next group.

38. The device according to claim 34, characterised in that one and more clusters are connected through additional clusters to the supply voltage and form isolated groups combined by a single common output electrode, and each isolated group of clusters is connected to one or more control input electrodes, the number of clusters in each group determines the weight function according to the input signal forming thereby a neurone-type logical component—a weight summator with memory.

39. The device according to claim 1, characterised in that the cluster is connected through additional cluster to the supply voltage, a junction point is connected to the output electrode, the input voltage is supplied directly through one or more control electrodes that are connected to clusters through the tunnel-transparent gap, forming thereby an inversion logical element with memory.

40. The device according to claim 1, characterised in that two clusters are connected to the supply voltage through additional clusters, the first input voltage is supplied directly through the first control electrode that is connected to one cluster through the tunnel-transparent gap, the second input voltage is supplied to the second electrode that is connected to the other cluster through the tunnel-transparent gap, some of junction points of resistive elements of each cluster are joined together and connected to the supply electrode through the resistive element, other junction points of additional clusters are connected to output electrodes that are outputs of the two signal analogue comparator with memory.

41. The device according to claim 1, characterised in that two clusters are connected through additional clusters to the supply voltage, junction points thereof are connected to output electrodes, the first input voltage is supplied directly through the first control electrode, that is connected to the first cluster through the tunnel-transparent gap, and the second input voltage is supplied directly through the second control electrode, that is connected to the second cluster through the tunnel-transparent gap, the first output electrode is connected to the second cluster through the tunnel-transparent gap, and the second output electrode is connected to the first cluster through tunnel-transparent gap, forming thereby a bistable trigger circuit.

42. The device according to claim 1, characterised in that two or more clusters are connected at least to two control electrodes, at least one of which is a light-transparent electrode, spacings between clusters are filled with a photosensitive semiconductor and a set of such clusters forms a photosensitive matrix.

43. The device according to claim 1, characterised in that one or more layers of clusters are connected to at least two distributed electrodes, at least one of which is a light transparent electrode, the spacings between clusters are filled with photosensitive semiconductor and form a light-sensitive storage medium.

44. The device according to claim 1, characterised in that one or more layers of clusters are connected to at least two electrodes, at least one of which is a light transparent electrode, the spacings between clusters are filled with an optically active material forming a display screen.

45. The device according to claim 1, characterised in that one or more layers of clusters are connected to at least two electrodes, at least one of which is a grid transparent for electron, the spacings between clusters are filled with material having a low work function of electron in vacuum, forming an electron source.

46. The device according to claim 1, characterised in that one or more layers of clusters are connected to at least two distributed electrodes made in the form of a resonator, forming thereby a high-frequency generator with a maximal cutoff frequency determined by the formula $f \leq m_e \alpha^4 c^2 / (2\pi \hbar)$.

47. The device according to claim 1, characterised in that one or more clusters are connected to the current source through electrodes or by direct contacting, at least one of the contacts is connected to the output electrode, allowing thereby to create a standard voltage source with levels determined by the formula $$U = n\alpha^3 c^2 m_e/2e,$$

wherein n is a number of clusters connected in series.

48. The method of operating the devices according to claim 1, comprising applying the electric field in the working range of strengths, characterised in that the magnitude of the field control strength at one cluster is determined in the range $$E_{min} \leq E \leq E_{max},$$

wherein $E_{min} = m_e^2 \alpha^5 c^3/2e\hbar$, $E_{max} = E_{min}/4\pi\alpha$; $\hbar$ is the Planck's constant; $m_e$ is the electron mass; e is the electron charge; $\alpha = 1/137036$ is the fine structure constant; c is the light speed.

49. The method of operating the device according to claim 48, characterised in feeding a continuous or/and pulse supply.

50. A quantum-sized electronic device comprising electrodes and located between them a layer of the material having a metal-semiconductor phase transition, characterised in that the layer of the material having a metal-semiconductor phase transition is made in the form of at least one cluster with cross-sectional dimensions determined by the formula:

$$D = a\, r_0,$$

wherein $r_0$ is a circular radius of a of an electron wave under the formula:

$$r_0 = \hbar/(m_e \alpha^2 c),$$

wherein $\hbar$ is Planck's constant, $m_e$ is the electron mass, $\alpha = 1/137,036$ is the fine structure constant; c—is the light speed; a is a coefficient determined in the range $2 \leq a \leq 4$, the distance between the electrodes exceeding $r_0$.

51. The device according to claim 50, characterised in that the cluster is connected to the supply electrodes and at least to one load, one or more control electrodes are connected through tunnel-transparent gap, the width of the tunnel-transparent gap is not more than $r_0$ and the distance between the electrodes is not less than $r_0$.

52. The device according to claim 50, characterised in that the electrodes are made of conductor and have a resistivity $$\rho \leq 10^{-3}\ \Omega \cdot cm.$$

53. The device according to claim 50, characterised in that the electrodes are made of conductor and have a cross-sectional dimension $d \geq r_0$.

54. The device according to claim 50, characterised in that the electrodes are made of superconductor and have a cross-sectional dimension $d \geq 2\, r_0$.

55. The device according to claim 50, characterised in that the said electrodes are made of material having a metal-semiconductor phase transition, and have a cross-sectional dimension $d \geq 2\, r_0$.

56. The device according to claim 50 characterised in that one or more clusters are connected to supply electrodes at least through one resistive layer.

57. The device according to claim 56, characterised in that two or more clusters are connected to supply electrodes and joined together in a group in the form of one layer of directly together contacting clusters, one or more clusters are connected to control input electrodes, and the other cluster or clusters are connected to the output electrodes forming thereby the output of the logical element "OR".

58. The device according to claim 56, characterised in that two or more clusters are connected to supply electrodes and integrated in a group in the form of one layer, one or more clusters are connected to the control input electrodes, and the other cluster or clusters are connected to the output electrodes, the input and output clusters are joined together through additional electrodes of the same thickness and width, the said electrodes can be connected to one or more clusters of the next group.

59. The device according to claim 56, characterised in that two or more clusters are connected to supply electrodes and integrated in a group in the form of one layer, one or more clusters are connected to control input electrodes, and the other cluster or clusters are connected to output electrodes, the input and output clusters are joined together through additional electrodes tapered at one side in the signal direction, the said electrodes can be connected to one or more clusters of the next group.

60. The device according to claim 50, characterised in that the input voltage is supplied directly through one or more control electrodes connected to clusters through tunnel-transparent gap, the cluster is connected through the resistive element to the supply voltage, and the junction point is connected to the output electrode, that is the output of the logical element "NOT".

61. The device according to claim 50, characterised in that two clusters are connected to the supply voltage through resistive elements, the first input voltage is supplied directly through the first control electrode connected to one cluster through the tunnel-transparent gap, the second input voltage is supplied to the second electrode connected to the other cluster through the tunnel-transparent gap, some of the junction points with the resistive elements of each cluster are joined, and the other junction points with the resistive elements are connected to output electrodes forming thereby the outputs of the two signal analogue comparator.

62. The device according to claim 50, characterised in that two clusters are connected through resistive elements to the supply voltage, the junction points thereof are connected to output electrodes, the first input voltage is supplied directly through the first control electrode connected with the first cluster through the tunnel-transparent gap, and the second input voltage is supplied directly through the second control electrode connected to the second cluster through the tunnel-transparent gap, first output electrode is connected to the second cluster through the tunnel-transparent gap, and the second output electrode is connected to the first cluster through the tunnel-transparent gap, forming thereby a bistable trigger.

63. The device according to claim 50, characterised in that one or more clusters are connected through the resistive layer to the supply voltage and form isolated groups joined together by one common output electrode, each isolated group of clusters is connected to one or more control input electrodes, the number of clusters in each group determines the weight function according to the input signal, forming thereby the neurone-type logical component—a weight summator.

64. The device according to claim 50, characterised in that two or more clusters are connected at least to two control electrodes, the gaps between clusters are filled with the photosensitive semiconductor, a set of such clusters forms a photosensitive matrix.

65. The device according to claim 50, characterized in that one or more layers of clusters are connected to at least two electrodes, at least one of which is a light transparent electrode, the spacings between the clusters are filled with the optically active material, forming a display screen.

66. The device according to claim 50, characterized in that one or more layers of clusters are connected to at least two electrodes, at least one of which is a grid that is transparent for electrons, the spacings between the clusters are filled with material having a low work function of electron in vacuum, forming an electron source.

67. The device according to claim 50, characterized in that one or more layers of clusters are connected to at least two distributed electrodes made in the form of resonator, forming thereby a high-frequency generator with a maximal cutoff frequency determined from the formula $$f \leq m_e \alpha^4 c^2/h.$$

68. A method for operating the devices according claim 50 that comprises transmitting an electric current at least through one cluster, characterised in that the current density through the cluster is limited by the value $$j \leq 4\pi e m_e^3 \alpha^8 c^4/h^3$$

wherein h is the Planck's constant; $m_e$ is the electron mass; e is the electron charge; $\alpha=1/137,036$ is the fine structure constant; c is the light speed.

69. The method for operating the devices according to claim 50, that comprises transmitting an electric current at least through one cluster, characterised in that with the use in the cluster of materials having the temperature of the metal-semiconductor phase transition higher than the operation temperature of the devices, the electric field strength per one cluster should be provided in the range $$E \geq m_e^2 \alpha^5 c^3/(2e\hbar),$$

wherein $\hbar$ is the Planck's constant; $m_e$ is the electron mass; e is the electron charge; $\alpha=1/137,036$ is the fine structure constant; c is the light speed.

70. The method for operating the devices according to claim 64 that comprises transmitting an electric current at least through one cluster, characterised in that in the cluster are used materials having a temperature of the metal-semiconductor phase transition higher than the operating temperature of devices.

71. A quantum-size electronic device comprising electrodes and at least one cluster located between them, characterised in that, the cluster is made of the material of the superconductor and the cluster has a cross-sectional dimension found from the formula:

$$D = a \cdot r_0,$$

wherein $r_0$ is determined as the circular radius of a of an electron wave under the formula:

$$r_0 = \hbar/m_e \alpha^2 c,$$

wherein $\hbar$ is the Planck's constant; $m_e$ is the electron mass; $\alpha=1/137,036$ is the fine structure constant; c is the light speed; a is a coefficient determined in the range of $2 \leq a \leq 4$, the distance between the electrodes exceeding $r_0$.

72. The device according to claim 71, characterised in that the cluster is connected to supply electrodes and at least one load, and to one or more control electrodes through tunnel-transparent gaps, the thickness of tunnel-transparent gaps not exceeding $r_0$.

73. The device according to claim 71, characterised in that the said electrodes are made of conductor, and have a resistivity $$\rho \leq 10^{-3} \ \Omega \cdot cm.$$

74. The device according to claim 71, characterised in that the said electrodes are made of conductor, and have a cross-sectional size $d \geq r_0$.

75. The device according to claim 71, characterised in that the said electrodes are made of superconductor and have a cross-sectional size $d \geq 2 \ r_0$.

76. The device according to claim 71, characterised in that the electrodes are made of the material having a metal-semiconductor phase transition, and have a cross-sectional dimension $d \geq 2 \ r_0$.

77. The device according to claim 71, characterised in that one or more clusters are connected to the supply electrodes at least through one resistive layer.

78. The device according to claim 71, characterised in that two or more clusters, are connected to the supply electrodes and integrated in a group in the form of one layer of directly together contacting clusters, one or more clusters are connected to the control input electrodes, the other cluster or clusters are connected to the output electrodes, forming thereby the output of the logical element "OR".

79. The device according to claim 71, characterised in that two or more clusters, are connected to supply electrodes and integrated in a group in the form of one layer, one or more clusters are connected to the control input electrodes, the other cluster or clusters are connected to the output electrodes, the input and output clusters are joined together through additional electrodes of the same thickness and width, the said electrodes can be connected to one or more clusters of the next group.

80. The device according to claim 71, characterised in that two or more clusters are connected to supply electrodes and joined together in a group in the form of one layer, one or more clusters are connected to the control input electrodes, and the other cluster or clusters are connected to output electrodes, the input and output clusters are connected together through additional electrodes tapered at one side in the signal passing direction, the said electrodes can be connected to one or more clusters of the next group.

81. The device according to claim 71, characterised in that the input voltage is supplied directly through one or more control electrodes connected to clusters through the tunnel-transparent gap, the cluster is connected through the resistive element to the supply voltage, and the junction point is connected to the output electrode, forming thereby the output of the logical element "NOT".

82. The device according to claim 71, characterised in that two clusters are connected to the supply voltage through resistive elements, the first input voltage is supplied directly through the first control electrode, that is connected to one cluster through the tunnel-transparent gap, the second input voltage is supplied to the second electrode, that is connected to the other cluster through the tunnel-transparent gap, some of junction points with the resistive elements of each cluster are joined together, and the junction points of connection to resistive elements are connected to the output electrodes, forming thereby the outputs of the analogue comparator with two signals.

83. The device according to claim 71, characterised in that two clusters are connected through resistive elements to the supply voltage, the junction points thereof are connected to the output electrodes, the first input voltage is supplied directly through the first control electrode that is connected to the first cluster through the tunnel-transparent gap, the second input voltage is supplied directly through the second control electrode, that is connected to the second cluster through the tunnel-transparent gap, the first output electrode is connected to the second cluster through the tunnel-transparent gap, and the second output electrode is connected to the first cluster through the tunnel-transparent gap, forming thereby a bistable trigger.

84. The device according to claim 71, characterised in that two or more clusters are connected through the resistive layer to the supply voltage and form isolated groups joined together by one common output electrode, each isolated group of clusters is connected to one or more control input electrodes, the number of clusters in each group determines the weight function according to the input signal, forming thereby a neurone-type logical component—a weight summator.

85. The method for operating the devices according to claim 71, characterised in that the operating mode of the devices is limited by the critical temperature of transition into the superconducting state of the used materials, that is determined from the formula $$T_c < m_e \alpha^3 c^2/(2k\pi),$$

wherein k is the Boltzmann's constant; $m_e$ is the electron mass; $\alpha=1/137036$ is the fine structure constant; c is the light speed.

86. The method for operating the devices according to claim 85, characterised in that the transition from the superconducting state into the normal sate under the effect of the control voltages takes place in presence of the strength of electric field at the cluster $$E > m_e^2 \alpha^5 c^3/(2he),$$

wherein h is Planck's constant.

87. A quantum-size electronic device, comprising electrodes at least one of which is made of superconductor or of material with the metal-semiconductor phase transition, characterised in that at least one region of at least one of the electrodes has a cross-sectional dimension determined from the formula:

$$d = n_d\, r_0,$$

wherein $r_0$ is determined as a circular radius of a of an electron wave under the formula:

$$r_0 = \hbar/(m_e \alpha^2 c),$$

wherein $\hbar$ is the Planck's constant; $m_e$ is the electron mass; $\alpha=1/137036$ is the fine structure constant; c is the light speed; $n_d$ is a coefficient determined in the range $1 \leq n_d \leq 2$.

88. The device according to claim 87, characterised in that in the area of the specified cross sectional size, a group of electrodes has at least one near region with the distance between not exceeding $2r_0$, forming thereby a transformer of direct or alternating current.

89. The device according to claim 87, characterised in that, in the area of the specified cross sectional size, two electrodes have at least two near regions with the distance between not exceeding $2r_0$, a direct or alternating current flows through one of the electrodes, and the second electrode is connected to the load, forming thereby a converter of direct current to alternating current.

90. The device according to claim 87, characterised in that two electrodes have at least two near regions with the distance between not exceeding $2r_0$, the alternating current of a specified frequency flows through one of the electrodes, and the second electrode is connected to the load, the direct current flows through the load, forming thereby a converter of alternating current to direct current.

91. The device according claim 87, characterised in that at least one of two electrodes has periodic regions of deviation (narrowing/expanding) from the specified electrode size, at least in two near regions with the distance between not exceeding $2r_0$, at least one of the electrodes is connected to the load, forming thereby a converter of the form of a current.

92. A quantum size electronic device comprising a superconducting element, characterized in that the superconducting element has a cross-sectional dimension determined from the formula:

$$D = n_d r_0,$$

wherein $r_0$ is determined as a circular radius of a of an electron wave under the formula:

$$r_0 = \hbar/(m_e \alpha^2 c),$$

wherein $\hbar$ is the Planck's constant; $m_e$ is the electron mass; $\alpha=1/137036$ is the fine structure constant; c is the light speed; a is a coefficient determined as $a \geq 2$.

93. The device according to claim 92, characterized in that the superconducting element consists of one or more clusters joint together in a group in the form of a chain and connected to the supply electrodes, the size of the cluster exceeding $2r_0$.

94. The device according to claim 92, characterized in that the superconducting element consists of two or more clusters joint together in the form of one or more layers and connected to the supply electrodes, the size of the cluster exceeding $2r_0$.

95. The device according to claim 92, characterized in that the superconducting element is made of a high-molecular organic material comprising electron donor centers.

96. The device according to claim 92, characterized in that the superconducting element is made in the form of a capillary with an covering comprising electron donor centers, the cavity having a size not exceeding $2r_0$.

97. The device according to claim 92, characterized in that the superconducting element is made in the form of semiconductor comprising electron donor centers.

98. The device according to claim 95, characterized in that the spacings between the electron donor centers is selected from the condition $$d \geq 4r_0.$$

99. The device according to claim 93, characterized in that the superconducting element is made in the form of a ring or a solenoid.

100. The method of operation of the device according to claim 92, characterized in that the working range of the devices is limited by the critical temperature of transition of the used materials into the superconducting state, the said temperature being determined from the formula $$T_c < m_e \alpha^3 c^2/(2k\pi),$$

wherein k is the Boltzmann's constant; $m_e$ is the electron mass; $\alpha=1/137036$ is the fine structure constant; c is the light speed.

101. The method of operation of the device according to claim 92, characterized in that the density of the current flowing through a cluster or a conductor is generally limited by the value $$j < 4\pi e m_e^3 \alpha^8 c^4/h^3,$$

wherein $h = 2\pi\hbar$ is the Planck's constant; e is the electron charge.

102. The method of operation of the device according to claim 92, characterized in that the working range of the devices is limited by the critical magnetic filed of transition of the used materials into the superconductive state, the said temperature being determined from the formula $$B_c < (m_e/e)[m_e(\alpha^2 c)^2/\hbar].$$

* * * * *